(12) United States Patent
Sasaki et al.

(10) Patent No.: US 8,274,165 B2
(45) Date of Patent: Sep. 25, 2012

(54) SEMICONDUCTOR SUBSTRATE, LAMINATED CHIP PACKAGE, SEMICONDUCTOR PLATE AND METHOD OF MANUFACTURING THE SAME

(75) Inventors: Yoshitaka Sasaki, Milpitas, CA (US); Hiroyuki Ito, Milpitas, CA (US); Atsushi Iijima, Shatin (HK)

(73) Assignees: Headway Technologies, Inc., Milpitas, CA (US); SAE Magnetics (H.K.) Ltd., Hong Kong (CN)

( * ) Notice: Subject to any disclaimer, the term of this patent is extended or adjusted under 35 U.S.C. 154(b) by 132 days.

(21) Appl. No.: 12/368,643

(22) Filed: Feb. 10, 2009

(65) Prior Publication Data
US 2010/0200959 A1    Aug. 12, 2010

(51) Int. Cl.
*H01L 23/544* (2006.01)

(52) U.S. Cl. ........ 257/797; 257/686; 257/692; 257/620; 257/48; 257/E21.523; 257/E21.524; 257/E23.179; 438/460; 438/401; 438/462; 438/975

(58) Field of Classification Search ........................ None
See application file for complete search history.

(56) References Cited

U.S. PATENT DOCUMENTS

| | | | |
|---|---|---|---|
| 5,953,588 A | | 9/1999 | Camien et al. |
| 7,127,807 B2 * | | 10/2006 | Yamaguchi et al. ............ 29/830 |
| 7,557,439 B1 * | | 7/2009 | Sasaki et al. .................. 257/686 |
| 7,947,534 B2 * | | 5/2011 | Punzalan et al. .............. 438/123 |
| 2003/0216009 A1 * | | 11/2003 | Matsuura et al. ............. 438/460 |
| 2005/0098779 A1 * | | 5/2005 | Nakajima et al. ............... 257/48 |
| 2007/0145579 A1 * | | 6/2007 | Hoshino et al. ................ 257/723 |
| 2009/0134527 A1 * | | 5/2009 | Chang ........................... 257/777 |
| 2009/0315189 A1 * | | 12/2009 | Sasaki et al. .................. 257/777 |
| 2010/0200977 A1 * | | 8/2010 | Sasaki et al. .................. 257/690 |

OTHER PUBLICATIONS

GANN, "Neo-Stacking Technology," HDI Magazine, (1999), 4 pgs., Miller Freeman, Inc.

* cited by examiner

*Primary Examiner* — Fei Fei Yeung Lopez
(74) *Attorney, Agent, or Firm* — Oliff & Berridge, PLC

(57) ABSTRACT

A semiconductor substrate has a plurality of groove portions formed along scribe lines. The semiconductor substrate includes: insulating layers formed in the plurality of groove portions; a rectangular unit region in contact with at least any one of the plurality of groove portions; and a wiring electrode including an extended terminal portion extended from the unit region to the inside of the groove portion. The semiconductor substrate is manufactured by forming a plurality of groove portions along scribe lines; embedding an insulating material in the plurality of groove portions and planarizing a surface to form insulating layers; and forming a wiring electrode including an extended terminal portion extended from a rectangular unit region in contact with at least any one of the plurality of groove portions to the inside of the groove portion.

17 Claims, 22 Drawing Sheets ively in one package, and a SIP using the three-dimensional mounting technique of laminating a plurality of chips has received attention recently. Known as

SEMICONDUCTOR SUBSTRATE, LAMINATED CHIP PACKAGE, SEMICONDUCTOR PLATE AND METHOD OF MANUFACTURING THE SAME

BACKGROUND

1. Field of the Invention

The present invention relates to a semiconductor substrate for manufacturing a laminated chip package including a plurality of laminated chips, a laminated chip package, a semiconductor plate, and a method of manufacturing the same.

2. Related Background Art

In recent years, electronic devices such as cellular phones and notebook personal computers need to be reduced in weight and improved in performance. With such needs, higher integration of electronic components used for the electronic devices has been required. Further, the higher integration of electronic components has been required also for increase in capacity of a semiconductor memory device.

Recently, System in Package (hereinafter referred to as a "SIP") has attracted attention as a highly integrated electronic component. The SIP is a device created by stacking a plurality of LSIs and mounting them in one package, and a SIP using the three-dimensional mounting technique of laminating a plurality of chips has received attention recently. Known as such a SIP is a package having a plurality of laminated chips, that is, a laminated chip package. The laminated chip package has an advantage that speed up of operation of circuits and reduction in stray capacitance of wiring become possible because the length of the wiring can be reduced as well as an advantage of capability of high integration.

Known as the three-dimensional mounting techniques for manufacturing the laminated chip package include a wire bonding system and a through electrode system. The wire bonding system is a system of laminating a plurality of chips on a substrate and connecting a plurality of electrodes formed on each of the chips and external connecting terminals formed on the substrate by wire bonding. The through electrode system is a system of forming a plurality of through electrodes in each of the laminated chips and realizing wiring between the chips by the through electrodes.

The wire bonding system has a problem of a difficulty in reducing the spaces between the electrodes in a manner that the wires are not in contact with each other, a problem of a difficulty in speeding up the operation of circuits because of a high resistance value of wires, and a problem of a difficulty in reducing the thickness.

Though the above-described problems in the wire bonding system are solved in the through electrode system, the through electrode system has a problem of increased cost of the laminated chip package because many processes are required for forming the through electrodes in each of the chips.

Conventionally known methods of manufacturing the laminated chip package are those disclosed, for example, in U.S. Pat. Nos. 5,953,588 and 7,127,807 B2, for example. In U.S. Pat. No. 5,953,588, the following manufacturing method is described. In this manufacturing method, first, a plurality of chips cut out of a wafer are embedded in an embedding resin. Then, a plurality of leads to be connected to the chips are formed to create a structure called Neo-Wafer. Subsequently, the Neo-Wafer is cut to create a plurality of structures called Neo-chips each including the chip, the resin surrounding the chip, and the plurality of leads. In this event, end faces of the plurality of leads connected to the chips are exposed on side surfaces of the Neo-chips. Then, a plurality of kinds of Neo-chips are laminated to create a laminated body. In this laminated body, the end faces of the plurality of leads connected to the chips at the respective layers are exposed on the same side surface of the laminated body.

Keith D. Gann, "Neo-Stacking Technology", HDI Magazine, December, 1999 describes that a laminated body is formed by the same method as the manufacturing method described in U.S. Pat. No. 5,953,588 and wiring is formed on two side surfaces of the laminated body.

On the other hand, U.S. Pat. No. 7,127,807 B2 discloses a multilayer module which is configured by laminating a plurality of active layers made by forming one or more electronic elements and a plurality of conductive traces on a flexible polymer substrate.

SUMMARY OF THE INVENTION

Incidentally, the laminated chip package is manufactured by the following procedure. First, a wafer (a device wafer) having a plurality of devices formed therein is created by performing wafer process. Then, a plurality of groove portions along scribe lines are formed in the device wafer. Further, a resin such as an epoxy resin, a polyimide resin or the like is embedded in the groove portions to form insulating layers to thereby create a grooved device wafer. Such grooved device wafers are bonded together with an insulating adhesive to create a laminated body. The laminated body is cut along the groove portions to manufacture laminated chip packages.

Meanwhile, if a defective chip is included in the completed laminated chip package, it is difficult to change that defective chip for a non-defective chip, and therefore inspection to examine presence or absence of defective chip in the laminated chip package is performed in the process of manufacturing the laminated chip package.

However, in order to perform such an inspection, it has been necessary to form the laminated chip package such that the wiring connected to the devices appears in the cut surface when the above-described laminated body is cut along the groove portions. For this end, it is necessary to form other wiring in addition to formation of electrode pads connected to the device, this is one of the factors to obstruct the simplification of the manufacturing process of the laminated chip package.

The present invention is made to solve the above problem, and it is an object to provide a semiconductor substrate including a structure that makes it possible to simplify the manufacturing process of a laminated chip package, a laminated chip package, a semiconductor plate, and a method of manufacturing the same.

To solve the above problem, the present invention is a semiconductor substrate having a plurality of groove portions formed along scribe lines, including: insulating layers formed in the plurality of groove portions; a unit region in contact with at least any one of the plurality of groove portions; and a wiring electrode including an extended terminal portion extended from the unit region to the inside of the groove portion.

In the above-described semiconductor substrate, the wiring electrode includes the extended terminal portion, so that when the semiconductor substrate is cut along the groove portion, the end face of the wiring electrode can be made to appear in the cut surface.

In the above-described semiconductor substrate, it is possible that the unit region is formed as a device region having a semiconductor device, the semiconductor substrate further has a surface insulating film which covers the semiconductor device and includes a connecting hole formed therein, and the wiring electrode is connected to the semiconductor device via the connecting hole.

Further, in the case of the above-described semiconductor substrate, it is preferable that the extended terminal portion is formed to overlap the insulating layer. This ensures that when the semiconductor substrates are stacked and then cut along the groove portion, the insulating layer lies between the end faces of the wiring electrodes.

Further, in the case of the above-described semiconductor substrate, it is possible that the wiring electrode has an electrode pad connected to the extended terminal portion.

Further, in the case of the above-described semiconductor substrate, it is possible that the plurality of groove portions are formed in a shape of stripes without intersecting with each other. Further, it is also possible that the plurality of groove portions are formed along every other scribe line.

Further, in the case of the above-described semiconductor substrate, it is possible that a plurality of the wiring electrodes are arranged along at least any one of the plurality of groove portions and form a wiring electrode group having an unevenly distributed structure in which the respective extended terminal portions thereof are unevenly extended at a part of all of the groove portions in contact with the unit region.

Further, in the case of the above-described semiconductor substrate, it is possible that a plurality of the wiring electrodes are arranged along at least any one of the plurality of groove portions and form a wiring electrode group having an unevenly distributed structure in which the respective extended terminal portions thereof are unevenly extended at a part of all of the groove portions in contact with the device region, and further have electrode pads connected to the extended terminal portions and form a gathered pad group in which all of the electrode pads are gathered between the extended terminal portions and the semiconductor device.

In addition, it is preferable that the extended terminal portion has a narrow-width structure narrower in width than the electrode pad.

Further, it is preferable that the insulating layer is formed using a resin having a low thermal expansion coefficient.

Further, the present invention provides a laminated chip package in which a plurality of devices plates each having a semiconductor chip are laminated, wherein the device plate has: an insulating layer covering at least a side surface of the semiconductor chip; and a wiring electrode connected to the semiconductor chip and having a wiring end face formed in a surface of the insulating layer, and wherein the laminated chip package has a connecting electrode connecting the wiring end faces of the device plates.

The above-described laminated chip package can be made such that an interposer having no semiconductor chip is laminated together with the device plates.

Further, the present invention provides a semiconductor plate manufactured using the semiconductor substrate according to claim 5, wherein only any one set of opposite side surfaces of two sets of opposite side surfaces are covered by the insulating layers made of the same material, and an end face of the wiring electrode is formed in at least any one side surface of the one set of opposite side surfaces.

Further, the present invention provides a semiconductor plate manufactured using the semiconductor substrate according to claim 6, wherein an end face of the wiring electrode covered by the insulating layer is formed only in any one side surface of four side surfaces.

Further, the present invention provides a method of manufacturing a semiconductor substrate, including the steps of: for a substrate, forming a plurality of groove portions along scribe lines; embedding an insulating material in the plurality of groove portions and planarizing a surface of the substrate to form insulating layers; and forming a wiring electrode including an extended terminal portion extended from a unit region in contact with at least any one of the plurality of groove portions to the inside of the groove portion.

Further, the present invention provides a method of manufacturing a semiconductor substrate, including the steps of: for an unprocessed substrate having a semiconductor device formed thereon, forming a plurality of groove portions along scribe lines; embedding an insulating material in the plurality of groove portions and planarizing a surface of the unprocessed substrate to form insulating layers; forming a surface insulating film on a surface of the unprocessed substrate; forming, in the surface insulating film, a connecting hole leading to the semiconductor device; and forming a wiring electrode including an extended terminal portion extended from a device region in which the semiconductor device is formed to the inside of the groove portion, and connected to the semiconductor device via the connecting hole.

In the case of the above-described manufacturing method, it is preferable that when the wiring electrode is formed, a plurality of the wiring electrodes are arranged along the groove portions to form a wiring electrode group.

Further, it is preferable that when the wiring electrode is formed, a plurality of the wiring electrodes are arranged along the groove portions and form a wiring electrode group having an unevenly distributed structure in which the respective extended terminal portions thereof are unevenly extended at a part of all of the groove portions in contact with the device region.

Further, it is preferable that when the wiring electrode is formed, a plurality of the wiring electrodes are arranged along the groove portions and form a wiring electrode group having an unevenly distributed structure in which the respective extended terminal portions thereof are unevenly extended at a part of all of the groove portions in contact with the device region, and electrode pads connected to the extended terminal portions are formed and form a gathered pad group in which all of the electrode pads are gathered between the extended terminal portions and the semiconductor device.

In addition, the present invention provides a method of manufacturing a laminated chip package to manufacture a laminated chip package in which a plurality of device plates each having a semiconductor chip are laminated, including the steps of: laminating at least two semiconductor substrates manufactured by the above-described manufacturing method to form a laminated body; and exposing end faces of the wiring electrodes formed on the semiconductor substrates and forming a connecting electrode connecting the end faces.

In this case, an interposer having no semiconductor chip may be laminated together with the device plates to form the laminated body.

The present invention will be more fully understood from the detailed description given hereinbelow and the accompanying drawings which are given by way of illustration only, and thus are not to be considered as limiting the present invention.

BRIEF DESCRIPTION OF THE DRAWINGS

FIG. 3 is cut along a groove portion 20 shown on the left side;

DESCRIPTION OF THE PREFERRED EMBODIMENTS

In the following, embodiments of the present invention will be described with reference to the drawings. Note that the same components will be referred to with the same numerals or letters, while omitting their overlapping descriptions.

First Embodiment

Structures of Semiconductor Wafer and Laminated Chip Package

To begin with, the structure of a semiconductor wafer 1 that is an example of a semiconductor substrate according to the present invention will be described with reference to FIG. 1 to FIG. 4.

Figure 1:
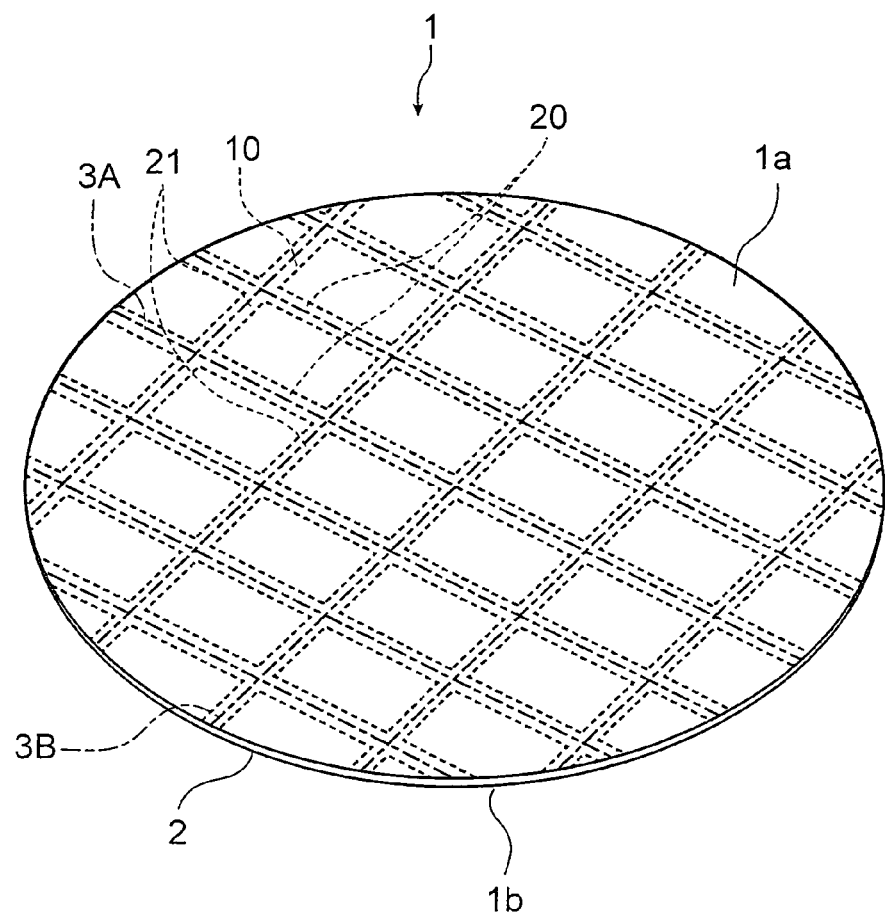
FIG. 1 is a perspective view illustrating the entire semiconductor wafer according to a first embodiment of the present invention.
Figure 2:
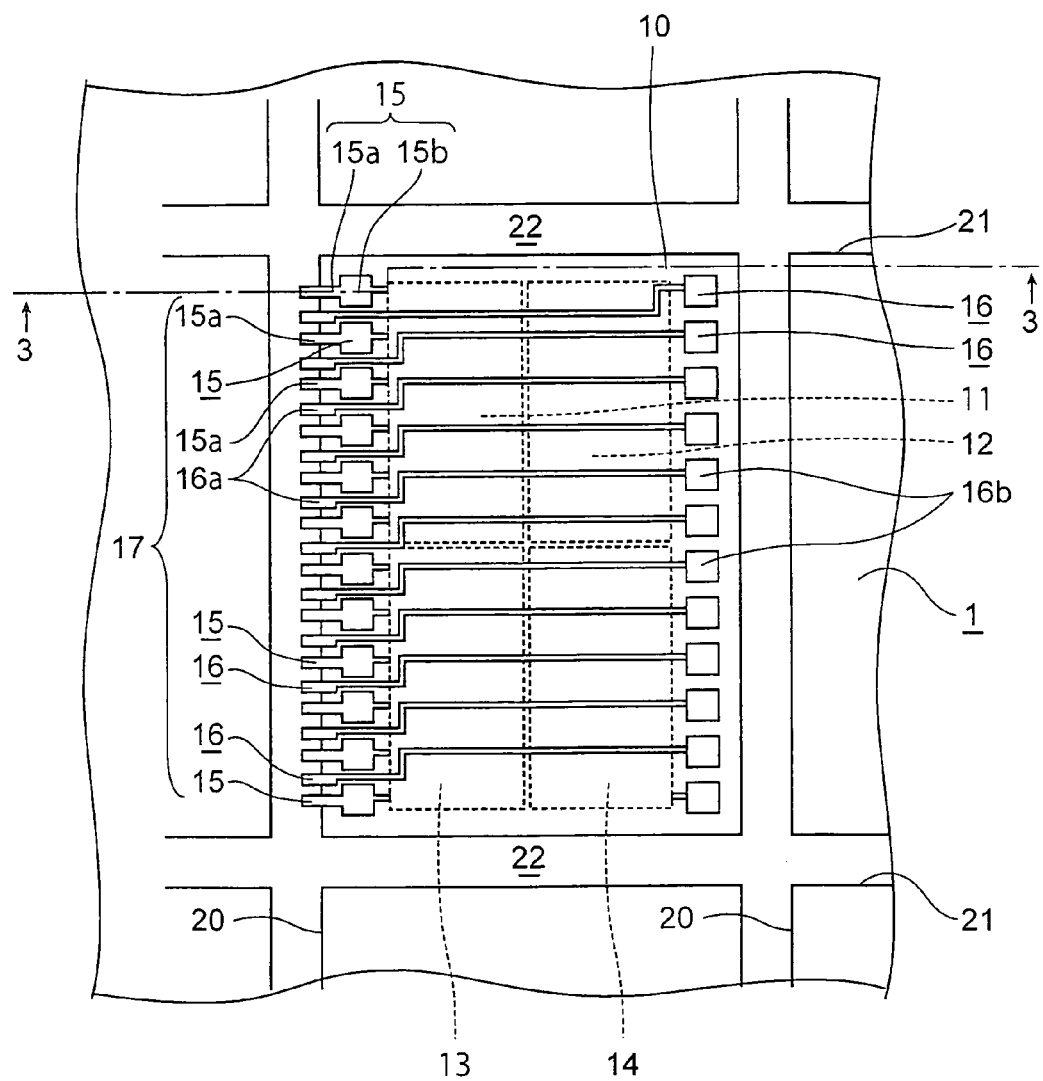
FIG. 2 is a plan view illustrating a device region and a region surrounding it formed in the semiconductor wafer.
Figure 3:
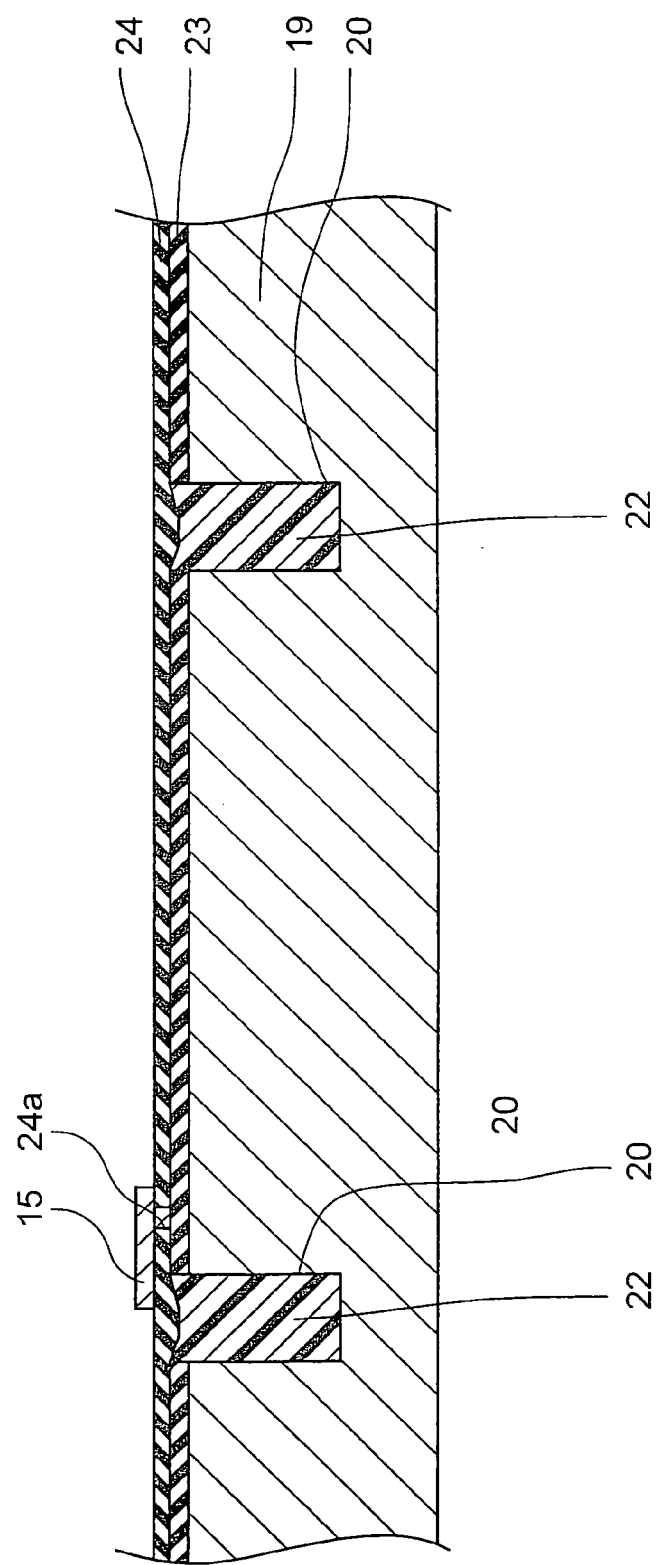
FIG. 3 is a sectional view taken along the line 3-3 in FIG. 2.
Figure 4:
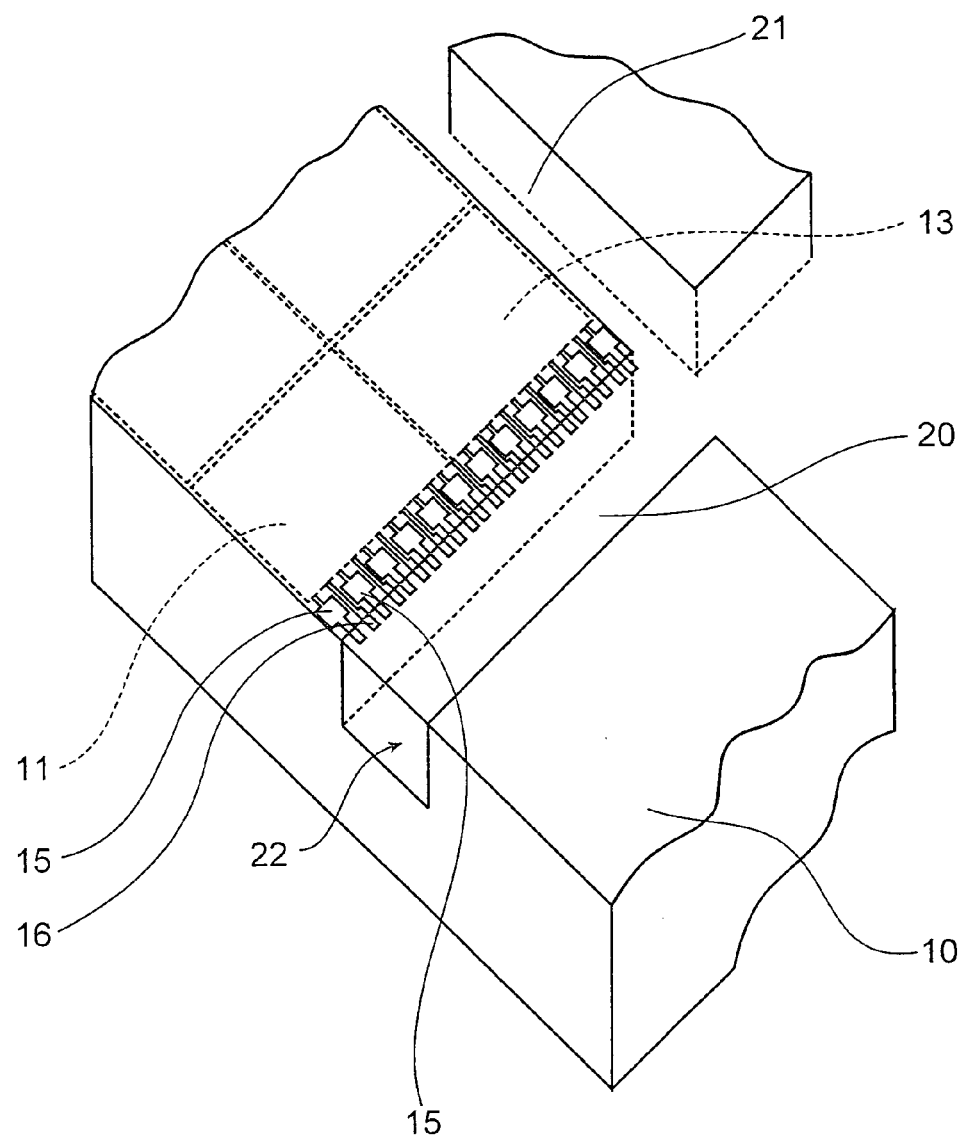
FIG. 4 is a perspective view illustrating the device region.

FIG. 1 is a perspective view illustrating the whole semiconductor wafer 1 according to the first embodiment of the present invention. FIG. 2 is a plan view illustrating a device region 10 and a region surrounding it formed in the semiconductor wafer 1, FIG. 3 is a sectional view taken along the line 3-3 in FIG. 2, and FIG. 4 is a perspective view illustrating the device region 10.

The semiconductor wafer 1 is composed using a silicon wafer 2. The semiconductor wafer 1 has, as illustrated in FIG. 1, scribe lines 3A and 3B formed on a first surface 1a of the silicon wafer 2 (the rear surface side of the first surface 1a is a second surface 1b). A plurality of each of the scribe lines 3A and 3B are formed on the first surface 1a and formed on straight lines at predetermined intervals along certain directions, respectively. The scribe lines 3A are orthogonal to the scribe lines 3B. The later-described device region 10 is formed within a region surrounded by the adjacent scribe lines 3A, 3A and 3B, 3B.

The semiconductor wafer 1 further has groove portions 20 and 21 formed in the first surface 1a. The groove portions 20 and 21 are formed along the scribe lines 3A and 3B, respectively, and each of them has a depth of about 20 to 60 μm and a width of about 50 to 120 μm.

The semiconductor wafer 1 further has insulating layers 22 formed in the groove portions 20 and 21 to fill the groove portions 20 and 21. The insulating layers 22 are formed by embedding an insulating material in the groove portions 20 and 21, and therefore are referred to also as embedded insulating layers. The insulating layers 22 can be formed using an insulating material made of, for example, an epoxy resin, a polyimide resin or the like. It is especially preferable to form the insulating layers 22 using a resin having a low thermal expansion coefficient. This ensures that when the semiconductor wafer 1 is cut along the groove portions 20 and 21 by a dicing saw, the cutting can be easily performed The semiconductor wafer 1 further has a silicon substrate 19 composed of the silicon wafer 2, an insulating layer 23 made of silicon dioxide ($SiO_2$) or the like formed on the silicon substrate 19, and a surface insulating film 24 made of polyimide or the like formed on the insulating layer 23. The surface insulating film 24 covers memory portions 11, 12, 13 and 14. The surface insulating film 24 is formed with connecting holes (referred also to as contact holes or via holes) 24a for connecting wiring electrodes 15 and 16 to semiconductor devices.

Next, the device region 10 is a rectangular region surrounded by the adjacent groove portions 20 and 20 and the groove portions 21 and 21 as illustrated in detail in FIG. 2. A plurality of the device regions 10 are formed on the first surface 1a, and each of them is a unit region divided from adjacent regions by the groove portions 20 and 21.

Each of the device regions 10 has the memory portions 11, 12, 13 and 14 formed on the first surface 1a by performing wafer process, and the later-described wiring electrodes 15 and 16 are formed. Note that the wafer process means a manufacturing process of forming a semiconductor element and an integrated circuit on the wafer such as the silicon wafer 2 or the like.

In addition to the memory portions 11, 12, 13 and 14, an integrated circuit and a semiconductor element such as a CPU, a sensor, a drive circuit for the sensor may be formed as the semiconductor devices within the device region 10. Further, a memory portion and an integrated circuit constituting a controller for controlling the memory portion may be formed in the device region 10.

In the memory portions 11, 12, 13 and 14, a number of later-described memory cells 41 as the semiconductor devices are formed. Among them, the memory portions 11 and 13 are arranged on the left side in the device region 10 and the memory portions 12 and 14 are arranged on the right side.

The wiring electrode 15 is made of a conductive material such as Cu or the like, and has an extended terminal portion 15a and a rectangular electrode pad 15b. The wiring electrode 16 is made of a conductive material such as Cu or the like, and has an extended terminal portion 16a and a rectangular electrode pad 16b. Each of the extended terminal portions 15a and 16a is formed in a band shape having a narrow-width structure narrower in width than the electrode pad 15b or 16b. The wiring electrode 15, 16 is connected to one of the semiconductor devices of the memory portions 11, 12, 13 and 14 via the connecting hole 24a.

The extended terminal portions 15a and the electrode pads 15b of the wiring electrodes 15 are formed outside the memory portions 11 and 13, whereas the extended terminal portions 16a of the wiring electrodes 16 are formed across the memory portions 11 and 12 or the memory portions 13 and 14. Further, the electrode pads 16b are disposed outside the memory portions 12 and 14.

A portion of each of the extended terminal portion 15a and the extended terminal portion 16a is extended from the device region 10 to the inside of the groove portion 20. More specifically, the extended terminal portion 15a and the extended terminal portion 16a are formed such that their portions on the tip end sides away from the electrode pads 15b and 16b protrude from the edge portion of the groove portion 20 to stay within the inside of the groove portion 20 in the width direction. The extended terminal portion 15a and the extended terminal portion 16a are formed such that their portions extended from the device region 10 overlap the insulating layer 22 with the surface insulating film 24 sandwiched between the portions and the insulating layer 22 (see FIG. 3 in detail).

Further, a number of the wiring electrodes 15 and 16 are alternately arranged along the groove portions 20. These wiring electrodes 15 and 16 are united together to form a wiring electrode group 17. Further, in the wiring electrodes 15 and 16 the extended terminal portions 15a and 16a are extended only to the groove portion 20 on the left side that is a part of the four groove portions which are all of the groove portions surrounding and contacting with the device region 10, that is, the two groove portions 20 and 20 and the two groove portions 21 and 21. The wiring electrode group 17 has an unevenly distributed structure by such an unevenly distributed arrangement of the extended terminal portions 15a and 16a.

Figure 5:
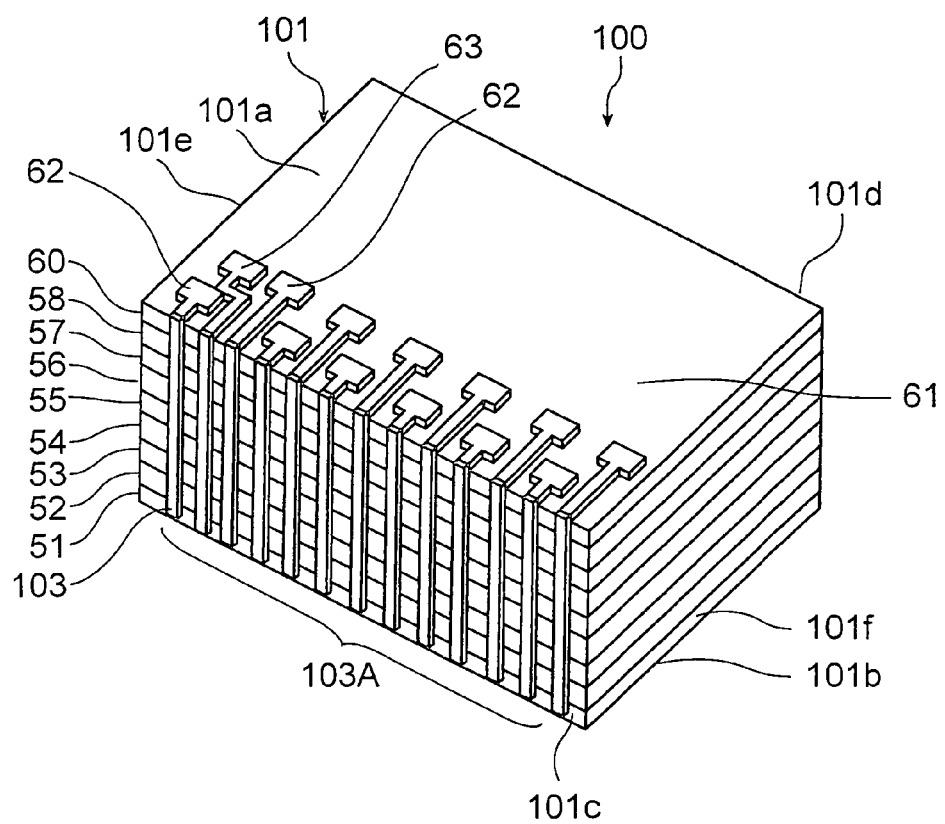
FIG. 5 is a perspective view illustrating a laminated chip package manufactured using the semiconductor wafer in FIG. 1.
Figure 6:
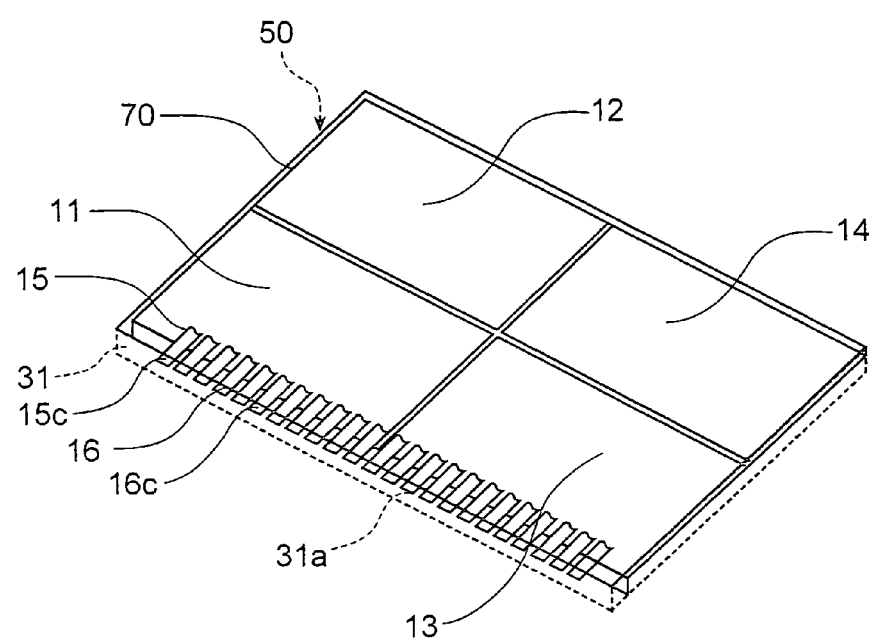
FIG. 6 is a perspective view illustrating a device plate included in the laminated chip package.
Figure 7:
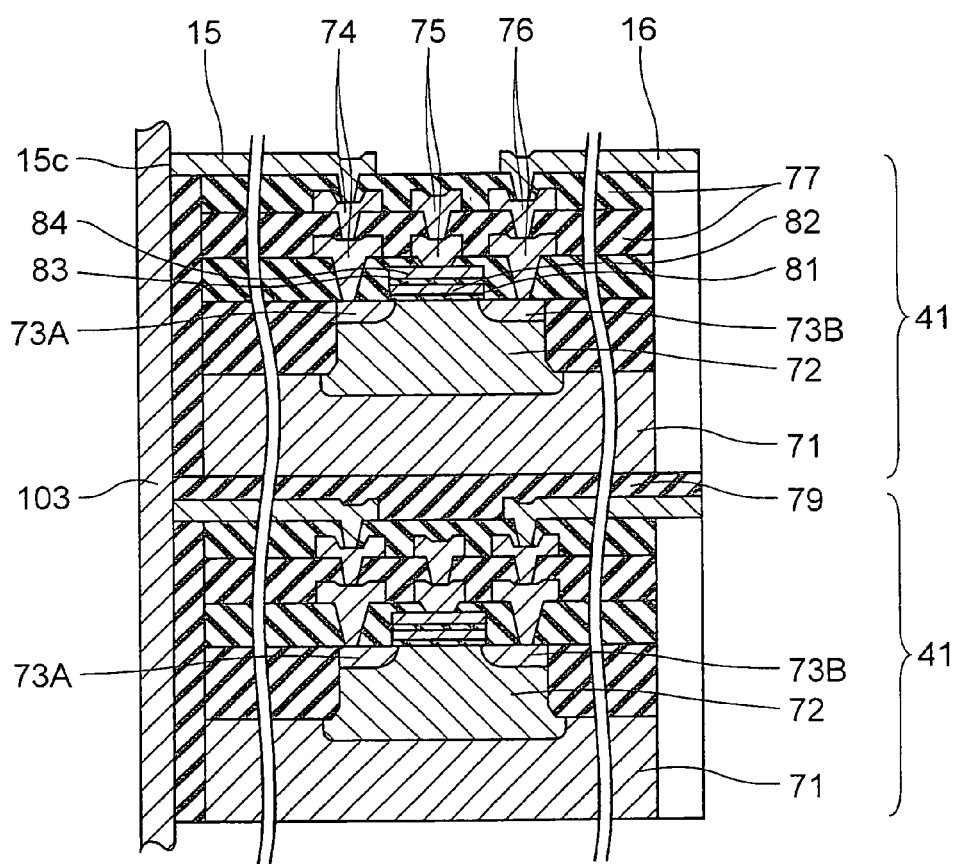
FIG. 7 is a sectional view mainly illustrating memory cells formed in two upper and lower semiconductor wafers.

By using a plurality of the same kind of semiconductor wafers 1 having the above-described structure, a laminated chip package 100 can be manufactured. Here, FIG. 5 is a perspective view illustrating the laminated chip package 100, and FIG. 6 is a perspective view illustrating a device plate 50 included in the laminated chip package 100. Further, FIG. 7 is a sectional view of the laminated chip package 100, mainly illustrating the memory cells 41 formed in upper and lower semiconductor wafers 1.

The laminated chip package 100 is formed in a rectangular parallelepiped shape having a top surface 101a and a bottom surface 101b as well as side surfaces 101c, 101d, 101e and 101f. The laminated chip package 100 has a connecting electrode group 103A formed on the side surface 101c of a device block 101, and the connecting electrode group 103A realizes a single side surface wiring performed for wiring of each device plate 50.

The connecting electrode group 103A is composed of a plurality of connecting electrodes 103. Each of the connecting electrodes 103 connects a pad-shaped terminal 62 to a later-described end face (wiring end face) 15c formed on each device plate 50. Each of the connecting electrodes 103 further connects a pad-shaped terminal 63 to a later-described end face (wiring end face) 16c formed on each device plate 50.

By varying the number of semiconductor chips 70 in such a laminated chip package 100, memories with various storage capacities such as 64 GB (gigabyte), 128 GB, and 256 GB can be realized.

The laminated chip package 100 is manufactured as follows. First, eight semiconductor wafers 1 described above are laminated to form a laminated body. Then, the laminated body is cut along the groove portions 20 and 21, whereby the wiring end faces 15c and 16c of the wiring electrodes 15 and 16 formed on each of the semiconductor wafers 1 are exposed. Subsequently, the connecting electrodes 103 connecting the wiring end faces 15c and 16c are formed to manufacture the laminated chip package 100.

Figure 19:
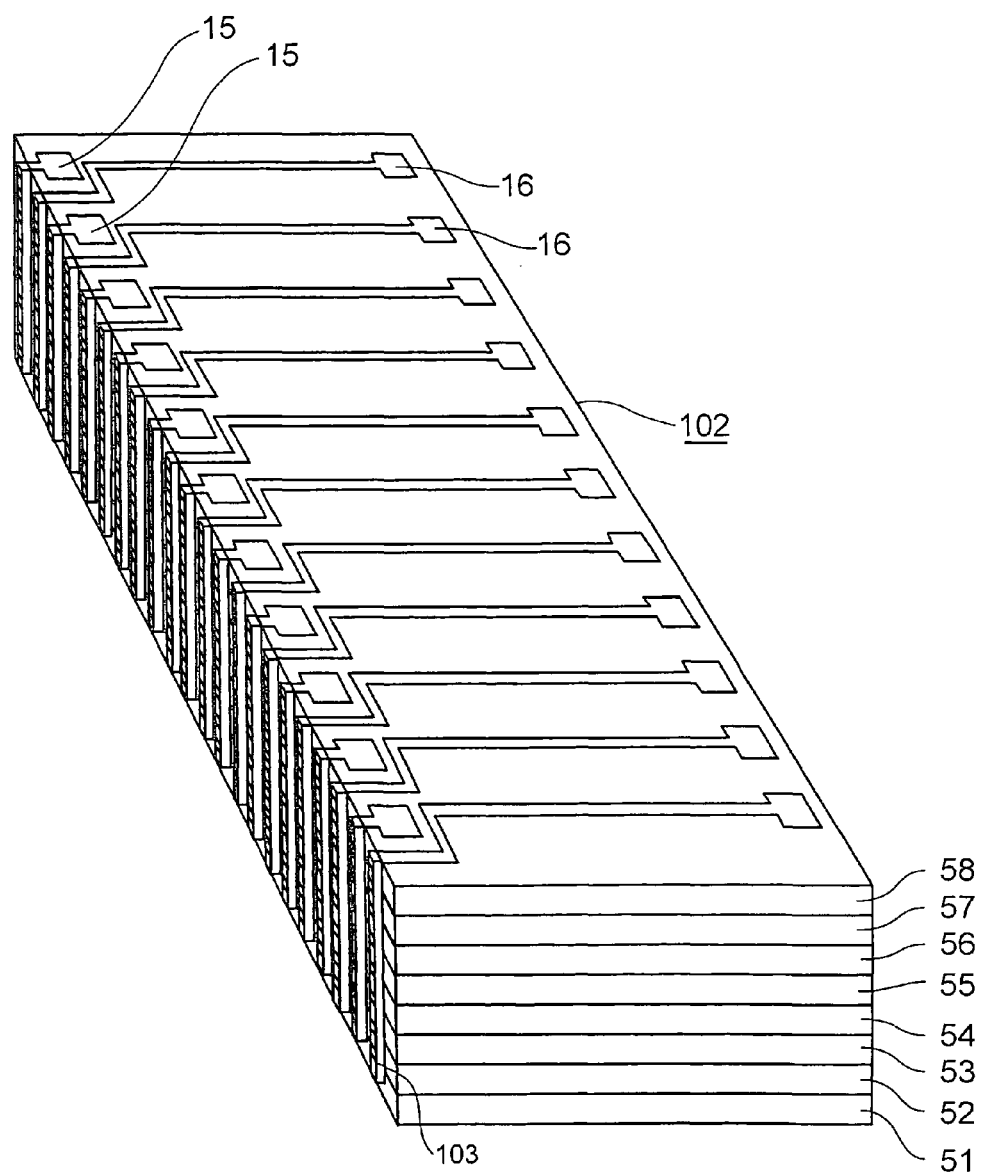
FIG. 19 is a perspective view illustrating a laminated chip package obtained by laminating only eight device plates.

The device block 101 is formed by laminating eight device plates 50 illustrated in FIG. 6 and further laminating a terminal layer 60. In FIG. 5, the device plates 50 are illustrated as 51, 52, 53, 54, 55, 56, 57 and 58. Though eight device plates 50 are laminated in FIG. 5, it is only necessary to laminate a plurality of device plates 50 and the number of the device plates 50 is not limited to eight. A laminated chip package 102 using a device block obtained by laminating only eight device plates 50 is illustrated in FIG. 19.

Between the respective device plates 50 and between the device plate 58 and the terminal layer 60 are bonded by a not-shown adhesive.

The terminal layer 60 is laminated on the device plate 58 which is placed at the uppermost layer. The terminal layer 60 is an interposer having a terminal layer main body 61 with a top surface and a bottom surface and a plurality of pad-shaped terminals 62 and 63 but no semiconductor chip. Both of the pad-shaped terminals 62 and 63 are disposed on the top surface of the terminal layer main body 61 to function as external connecting terminals of the laminated chip package 100. The pad-shaped terminals 62 and 63 are alternately formed corresponding to the above-described wiring electrodes 15 and 16, respectively. However, only one pad-shaped terminal 63 is illustrated and the other pad-shaped terminals 63 are omitted in FIG. 5 for convenience of illustration.

The pad-shaped terminals 62 and 63 further have not-shown end faces on the side surface 101c, and the connecting electrodes 103 are connected to the respective end faces.

The device plate 50 has the semiconductor chip 70 including the memory portions 11, 12, 13 and 14, and an insulating portion 31. The insulating portion 31 has four end faces 31 such that the four end faces 31a cover all of the four side surfaces of the semiconductor chip 70. The insulating portion 31 is obtained from the insulating layers 22. As illustrated in FIG. 6, the end faces (wiring end faces) 15c and 16c are formed in any one of the end faces 31a. The end faces (wiring end faces) 15c and 16c are end faces appearing at cut portions of the extended terminal portions 15a and 16a when the semiconductor wafer 1 is cut along the groove portion 20 on the left side as illustrated also in FIG. 14. The end faces 15c and 16c are surrounded by the insulating portion 31 and connected to the connecting electrodes 103.

Meanwhile, the memory cell 41 is formed on the surface of an N-type substrate 71 constituting the semiconductor wafer 1 as illustrated in FIG. 7. In FIG. 7, two memory cells 41 are laminated one on the other via an adhesive layer 79 formed by the adhesive used when the semiconductor wafers 1 are bonded together.

Each of the memory cells 41 constitutes a flash memory and is formed on a P-type well 72 which is formed on the surface of the N-type substrate 71. The memory cell 41 has a source 73A and a drain 73B, insulating layers 77, an insulating film 81, a floating gate 82, an insulating film 83 and a control gate 84. The memory cell 41 further has a source electrode 74, a drain electrode 76 and a gate electrode 75.

Both of the source 73A and the drain 73B are N-type regions and connected with the source electrode 74 and the drain electrode 76, respectively. The insulating layers 77 are formed with contact holes for connecting the wiring electrodes 15 and 16 to the source electrode 74 and the drain electrode 76, respectively. The source electrode 74, the gate electrode 75, and the drain electrode 76 are connected to the source 73A, the control gate 84 and the drain 73B via the corresponding contact holes, respectively.

Manufacture of the above-described laminated chip package 100 using the semiconductor wafers 1 having the above-described structure is performed as follows.

First, a plurality of semiconductor wafers 1 are prepared and bonded together with an adhesive, and the second surface 1b side thereof is polished, and the semiconductor wafers 1 are then cut along the scribe lines 3A and 3B using a dicing saw. Thereafter, the connecting electrodes 103 are formed and so on to manufacture the laminated chip package 100.

However, if a defective semiconductor chip 70 is included in the completed laminated chip package 100, it is difficult to change that semiconductor chip 70 for a non-defective semiconductor chip 70. This is because of the following reason.

Namely, since the laminated chip package 100 is manufactured by the through electrode system, the semiconductor chips 70 placed one on the other are connected together. Therefore, in order to remove the defective semiconductor chip 70, the wiring connecting the semiconductor chips 70 needs to be removed by melting the wiring and so on, and during the melting and so on, poor condition can occur in the electrical connection of the non-defective semiconductor chips 70.

Hence, when the laminated chip package 100 is manufactured, it is necessary to inspect weather the defective semiconductor chip 70 is included or not in the laminated chip package 100, and the inspection needs to be performed as follows.

Namely, it is necessary to form a not-shown laminated body by bonding a plurality of semiconductor wafers 1 together using an adhesive such that the wiring connected to the semiconductor chips 70 appear in a cut surface (hereinafter, referred to as a "laminated body cur surface") when the laminated body is cut along the groove portions 20 and 21 by the dicing saw.

Figure 14:
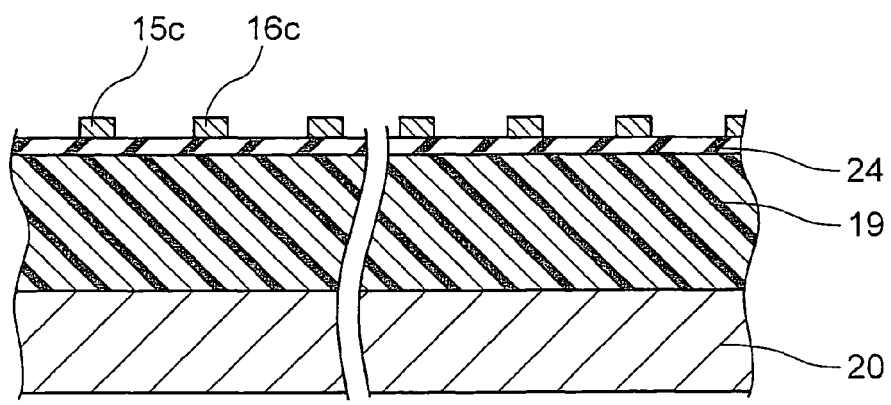
FIG. 14 is a sectional view when

In this case, the semiconductor wafer 1 has the extended terminal portions 15a and 16a extended to the inside of the groove portion 20, so that when the laminated body is cut along the groove portions 20, the extended terminal portions 15a and 16a can be cut. In this event, the end faces 15c and 16c of the wiring electrodes 15 and 16 can be made to appear in the laminated body cut surface. In other words, about one semiconductor wafer 1 constituting the laminated body when the laminated body cut surface is illustrated, the end faces 15c and 16c can appear as illustrated in FIG. 14.

Figure 10:
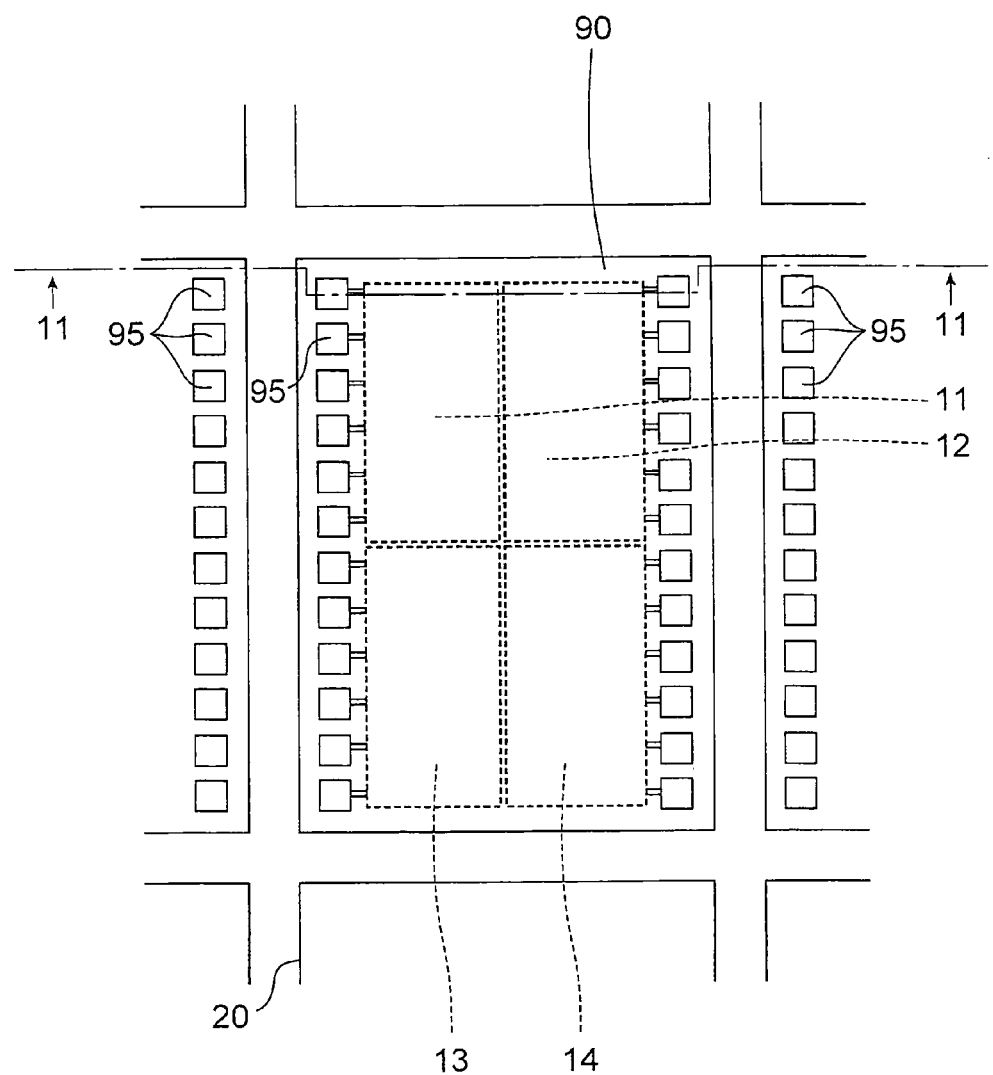
FIG. 10 is a plan view illustrating a device region and a region surrounding it relating to the present invention.
Figure 11:
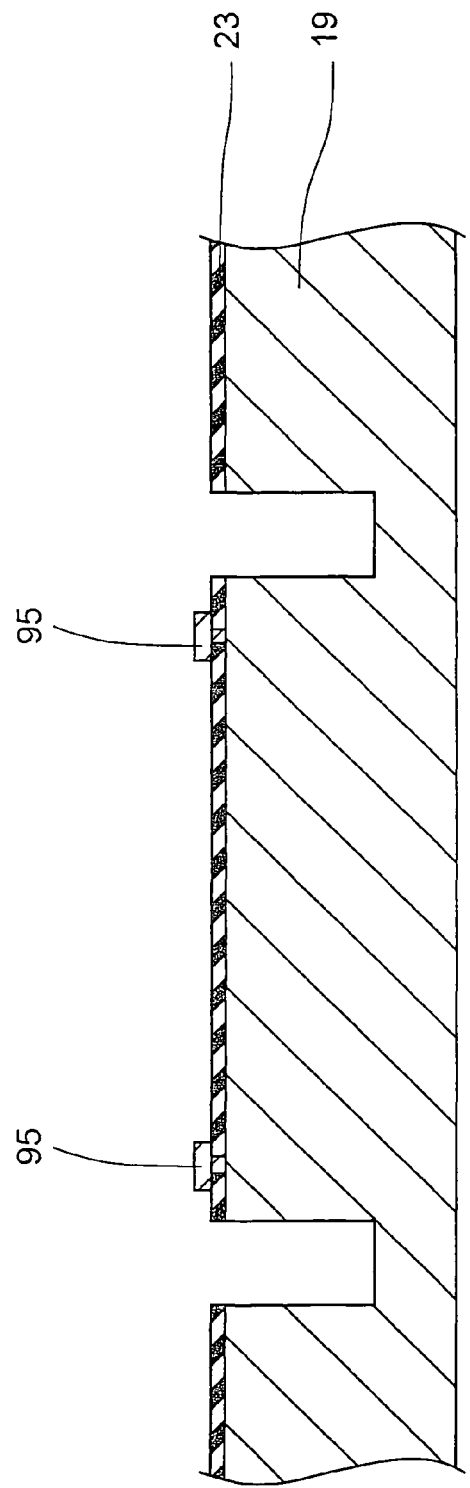
FIG. 11 is a sectional view taken along the line 11-11 in FIG. 10.

Here, it is assumed that there is a semiconductor wafer including a device region 90 as illustrated in FIG. 10. In the case of this semiconductor wafer, wiring electrodes 95 having no extended terminal portions as in the wiring electrodes 15 and 16 are formed in the device region 90. This means that the wiring electrodes 95 exist only within the device region 90, and therefore end faces of the wiring electrodes 95 cannot appear in the laminated body cut surface.

Accordingly, in the case of such a semiconductor wafer, in order that the wiring connected to the semiconductor chips 70 appears in the laminated body cut surface, other wiring connecting the wiring electrodes 95 of adjacent device regions 90 and 90 needs to be formed across the groove portion 20. This means that extra steps are required to manufacture the laminated chip package in the case of using such a semiconductor wafer as compared to the case of using the semiconductor wafer 1. Therefore, when such as semiconductor wafer is used, the manufacturing process of the laminated chip package cannot be simplified.

For the semiconductor wafer 1, however, the end faces 15c and 16c can be made to appear in the laminated body cut surface because the wiring electrodes 15 and 16 having the extended terminal portions 15a and 16a are formed. Accordingly, in the case of using the semiconductor wafer 1, it is not necessary to provide the other wiring as in the case of using the semiconductor wafer having the device regions 90, so that the process of manufacturing the laminated chip package can be simplified.

Further, the wiring electrodes 15 and 16 are formed to overlap the insulating layer 22. Therefore, when the end faces 15c and 16c appear in the laminated body cut surface, the end faces 15c and 16c placed one on the other will be arranged via the insulating layers 22. Accordingly, a situation that the semiconductor chips 70 located one on the other short-circuit can be prevented.

Further, the wiring electrodes 15 and 16 in the semiconductor wafer 1 form the wiring electrode group 17, and the wiring electrode group 17 has an unevenly distributed structure in which the wiring electrodes 15 and 16 are unevenly distributed at a part of the groove portions 20 and 21 which are in contact with the device region 10. This ensures that when the laminated chip package 100 is manufactured using the semiconductor wafer 1, the wiring connecting to the semiconductor chip 70 can be placed closely to a single side surface to realize the single side surface wiring of the laminated chip package 100.

Consequently, the semiconductor wafer 1 is suitable for manufacturing the laminated chip package 100 which may realize the single side surface wiring. Further, because the above-described inspection needs to be performed only on the single side of the laminated body cut surface of the semiconductor wafer 1, the process of manufacturing the laminated chip package can be further simplified.

In addition, because the extended terminal portions 15a and 16a have a narrow-width structure having narrower widths than those of the electrode pads 15b and 16b, many wiring electrodes 15 and 16 can be arranged in the device region 10. Accordingly, the wiring density of the wiring electrodes 15 and 16 can be increased in the semiconductor wafer 1. Furthermore, the memory portions 11, 12, 13 and 14 of each device region 10 are formed on the same plane in the semiconductor wafer 1, so that the alignment error is 0 (zero).

Method of Manufacturing Semiconductor Wafer

Figure 8:
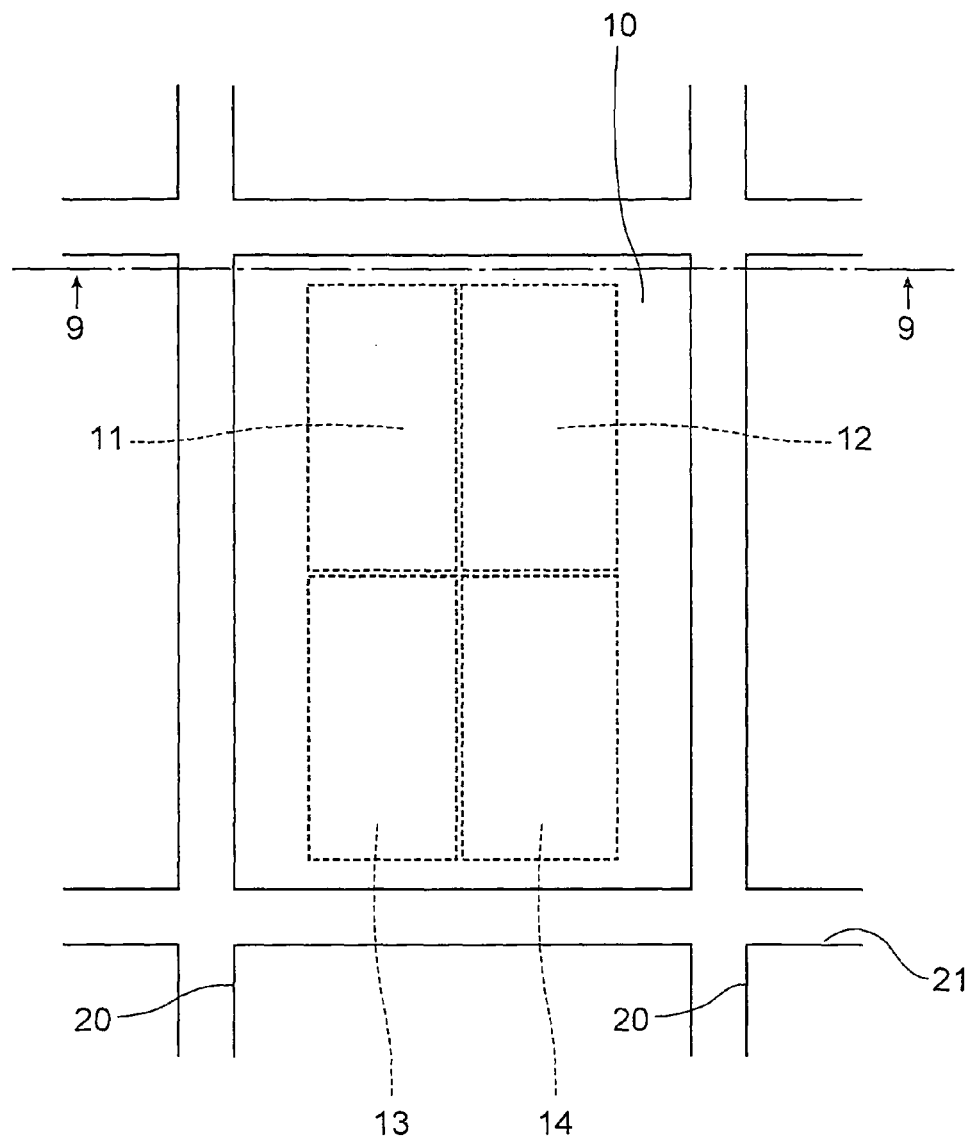
FIG. 8 is a plan view illustrating a device region and a region surrounding it in the process of manufacturing the semiconductor wafer.
Figure 9:
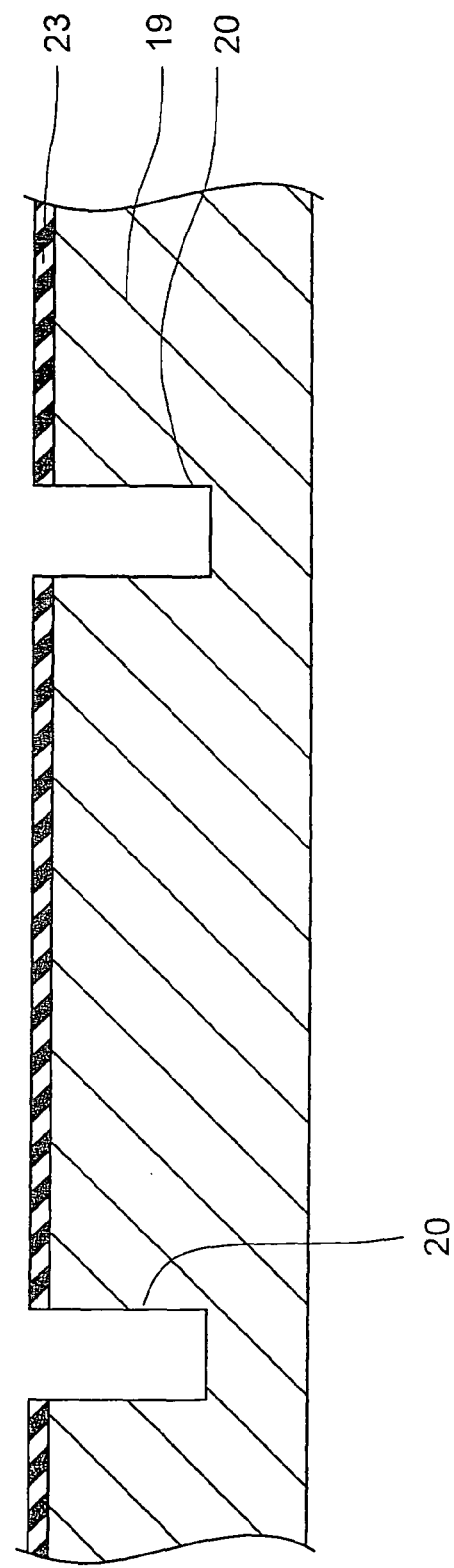
FIG. 9 is a sectional view taken along the line 9-9 in FIG. 8.

For manufacturing the semiconductor wafer 1, a wafer (unprocessed wafer) is prepared which has the memory portions 11, 12, 13 and 14 formed thereon by performing wafer processing. Then, the insulating layer 23 is formed on the first surface 1a for the unprocessed wafer, and then the groove portions 20 and 21 are formed along the scribe lines 3A and 3B as illustrated in FIGS. 8 and 9. The groove portions 20 and 21 can be formed by the dicing saw, and may be formed by etching such as the reactive ion etching or the like.

Next, an insulating material made of a resin, for example, an epoxy resin, a polyimide resin or the like, or silicon silicate glass (SOG) or the like for forming the insulating layers 22 is applied to the surface of the unprocessed wafer. Subsequently, the surface of the unprocessed wafer is polished to be planarized. Thus, the insulating layers 22 can be formed such that they are embedded in the groove portions 20 and 21 as illustrated in FIG. 3.

Subsequently, the surface insulating film 24 is formed on the surface of the unprocessed wafer. Further, the connecting holes 24a for connection to the semiconductor chip 70 are formed in the surface insulating film 24, and the wiring electrodes 15 and 16 are then formed. The wiring electrodes 15 and 16 are formed in the shapes including the above-described extended terminal portions 15a and 16a. The wiring electrodes 15 and 16 can be formed, for example, in the procedure as follows.

First, a not-shown seed layer for plating is formed on the surface insulating film 24. Next, a frame (not shown) including groove potions is formed on the seed layer. The frame is formed, for example, by patterning a photoresist by the photolithography. Further, a plating layer which will be portions of the wiring electrodes 15 and 16 is formed within the groove portions of the formed frame and on the seed layer. Subsequently, the frame is removed, and a portion of the seed layer other than the portion which exists under the plating layer is removed by etching. By the above processing, the wiring electrodes 15 and 16 can be formed of the plating layer and the seed layer thereunder.

In forming the wiring electrodes 15 and 16, a plurality of the wiring electrodes 15 and 16 can be arranged to from the wiring electrode group 17 as described above. Further, the wiring electrode group 17 can be formed to have the above-described unevenly distributed structure. Note that in manufacturing the later-described laminated chip package, the second surface 1b side of the semiconductor wafer 1 is polished down to the bottom portions of the groove portions 20 and 21.

Second Embodiment

Structure of Semiconductor Wafer

Figure 12:
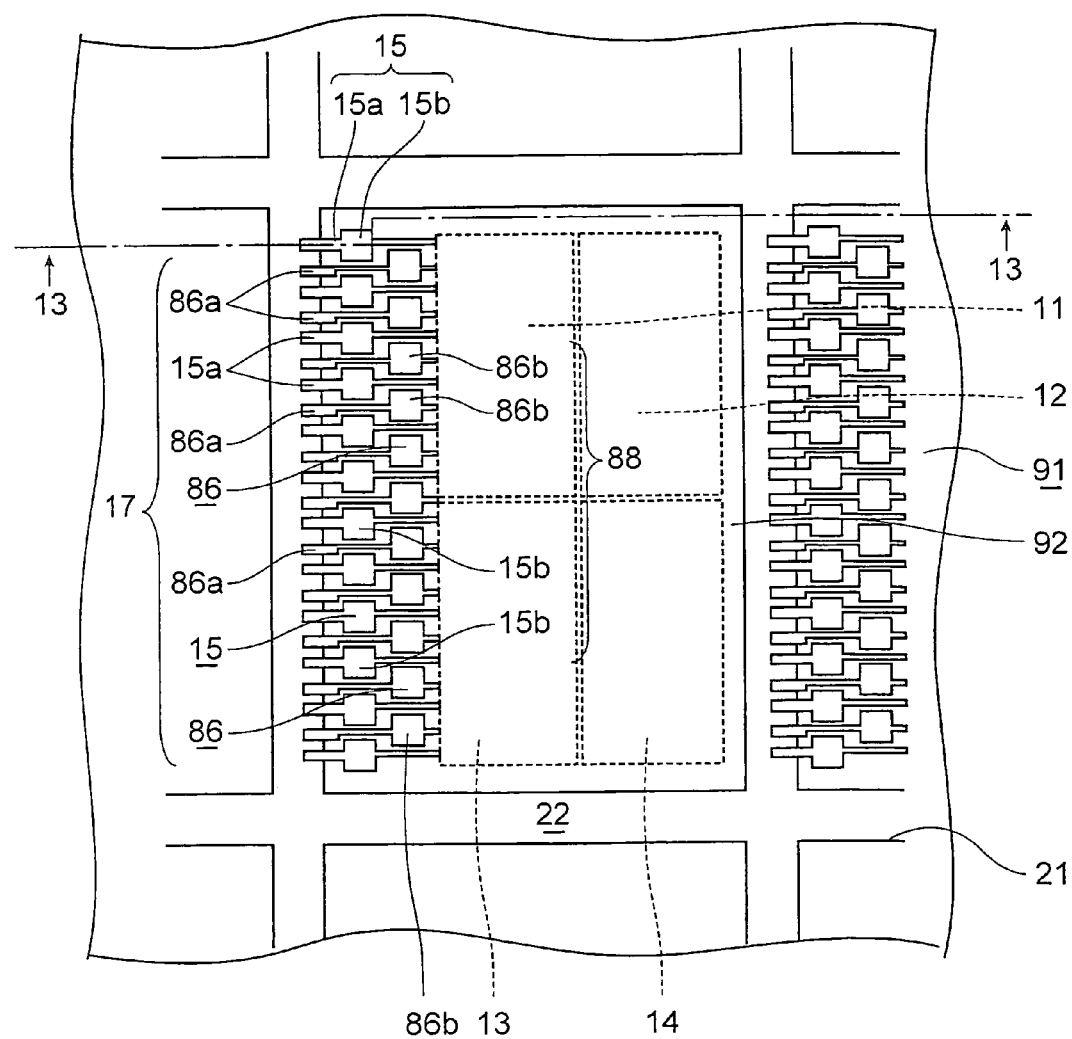
FIG. 12 is a plan view illustrating a device region and a region surrounding it formed in a semiconductor wafer according to a second embodiment of the present invention.
Figure 13:
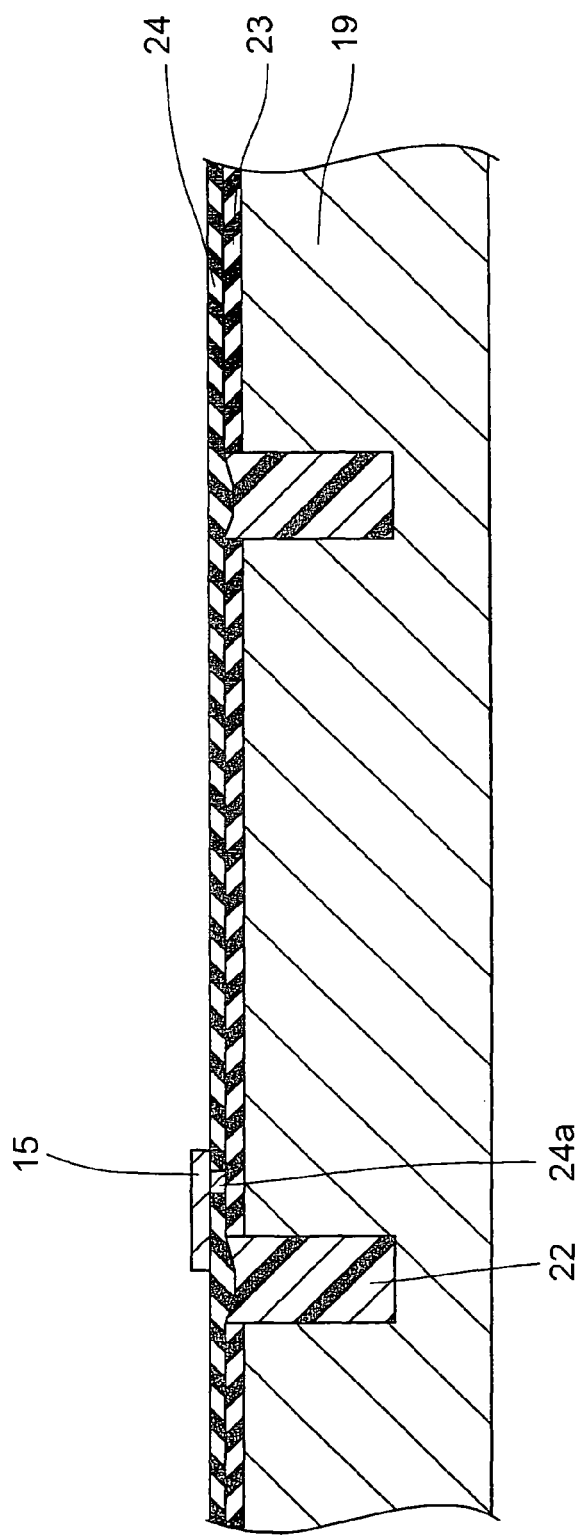
FIG. 13 is a sectional view taken along the line 13-13 in FIG. 12.

To begin with, the structure of a semiconductor wafer 91 according to the second embodiment of the present invention will be described with reference to FIG. 12 and FIG. 13.

The semiconductor wafer 91 according to this embodiment is different in that it has a device region 92 in place of the device region 10 and that it has wiring electrodes 86 in place of the wiring electrodes 16.

The device region 92 is different in that the memory portions 11, 12, 13 and 14 are located on the right side as compared with the device region 10. Further, the device region 92 is different from the device region 10 in that the wiring electrodes 86 are formed as well as the wiring electrodes 15.

The wiring electrode 86 is made of a conductive material such as Cu or the like, and has an extended terminal portion 86a and a rectangular electrode pad 86b. Further, like the wiring electrode 15, the extended terminal portion 86a and the electrode pad 86b of the wiring electrode 86 are formed outside the memory portions 11 and 13. Thus, within the device region 92, the wiring electrodes 15 and 86 form a wiring electrode group 17 that is the same as in the device region 10, and additionally, all of their electrode pads 15b and 86b are gathered between the extended terminal portions 15a and 86a and the memory portions 11, 12, 13 and 14. In such a manner, the wiring electrodes 15 and 86 form a gathered pad group 88 in the device region 92.

In the semiconductor wafer 1 according to the first embodiment, the extended terminal portion 16a of the wiring electrode 16 is formed across the memory portions 11 and 12 or the memory portions 13 and 14. Therefore, a certain length of the extended terminal portion 16a needs to be secured in the semiconductor wafer 1.

On the other hand, the extended terminal portion 86a is formed outside the memory portions 11 and 13 in the semiconductor wafer 91, so that the length of the extended terminal portion 86a can be made shorter than the extended terminal portion 16a. In the semiconductor wafer 91, the length of the extended terminal portion 86a is reduced to allow more quick access to the memory portion 11, 12, 13 or 14. Further, the amount of plating or the like required for forming the wiring electrodes 86 can be reduced as compared to the case of forming the wiring electrode 16, resulting in reduced cost.

In addition, the semiconductor wafer 91 can be used to simplify the manufacturing process of the laminated chip package which can realize the single side surface wiring, as with the semiconductor wafer 1.

Figure 20:
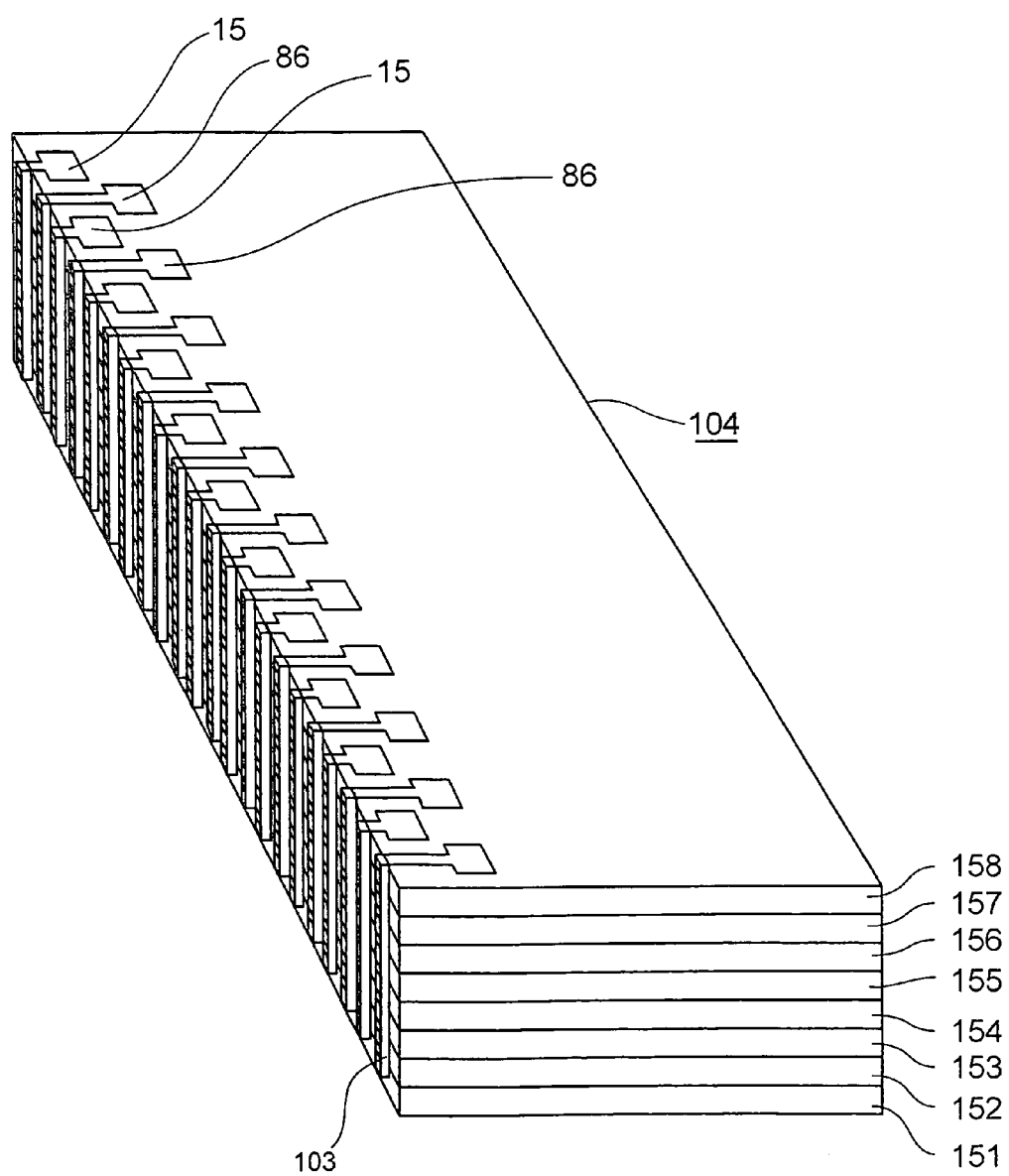
FIG. 20 is a perspective view illustrating another laminated chip package.

Further, it is possible to manufacture device plates 151 to 158 which are similar to the device plate 50 using the semiconductor wafer 91, and laminate the eight device plates 151 to 158 one on the other to thereby manufacture a laminated chip package having a device block as illustrated in FIG. 20.

Method of Manufacturing Semiconductor Wafer

The manufacture of the semiconductor wafer 91 is performed similarly to the manufacture of the semiconductor wafer 1 before the formation of the wiring electrodes 15 and 86. Thereafter, the wiring electrodes 15 and 86 are formed in shapes including the above-described extended terminal portions 15a and 86a. The wiring electrodes 15 and 86 can be formed by the procedure similar to that of the semiconductor wafer 1.

Third Embodiment

Structure of Semiconductor Wafer

Figure 15:
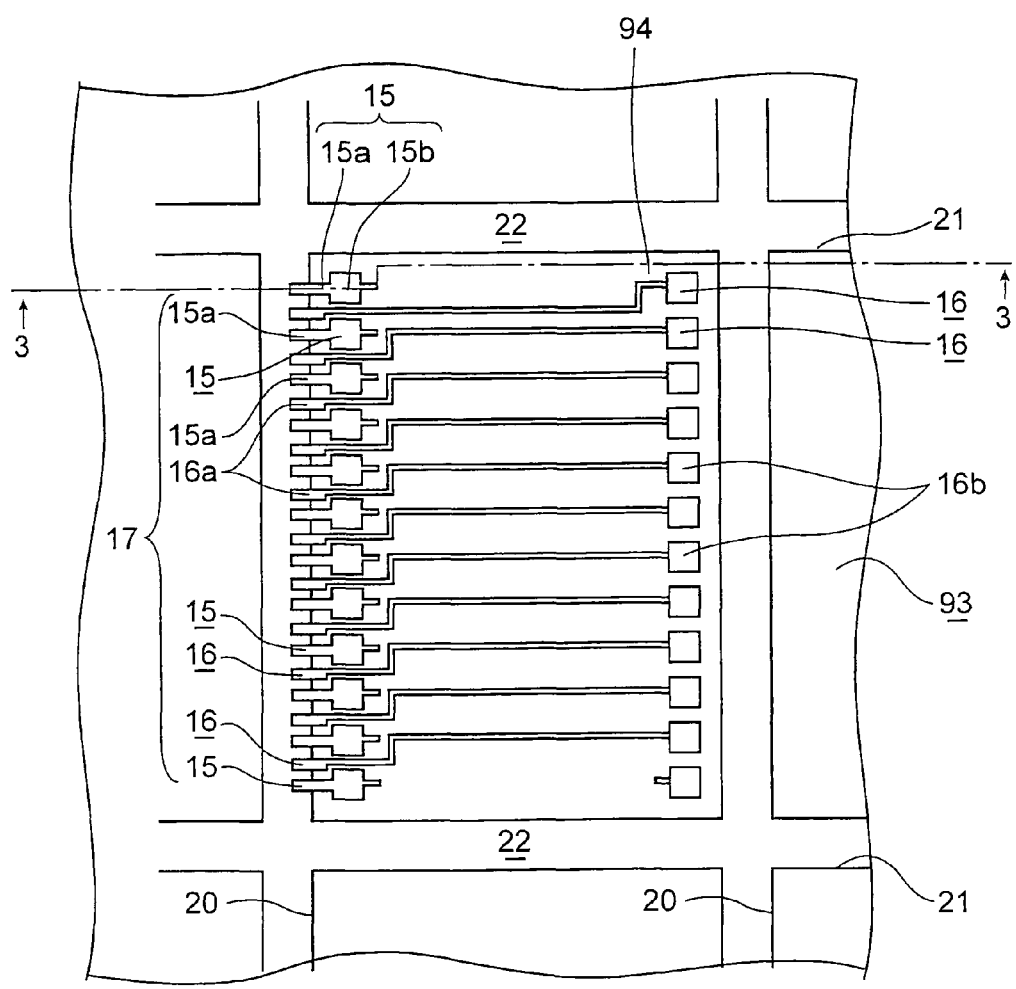
FIG. 15 is a plan view illustrating a unit region and a region surrounding it formed in a semiconductor wafer according to a third embodiment of the present invention.

To begin with, the structure of a semiconductor wafer 93 according to the third embodiment of the present invention will be described with reference to FIG. 15.

The semiconductor wafer 93 according to this embodiment is different in that it has a unit region 94 in place of the device region 10.

The unit region 94 is different from the device region 10 in that the memory portions 11, 12, 13 and 14 are not formed, but common in other points. Also in the device region 94, the wiring electrodes 15 and 16 which are the same as those in the device region 10, so that the semiconductor wafer 93 can be used to simplify the manufacturing process of the laminated chip package which can realize the single side surface wiring.

A chip having only the wiring electrodes 15 and 16 but no semiconductor device formed therein as in the semiconductor wafer 93 is referred to as an interposer. In contrast, a semiconductor wafer having semiconductor devices as in the semiconductor wafer 1 is referred to as a device wafer.

The laminated chip packages include the one in which only device plates composed of the device wafers are laminated as in the above-described laminated chip package 102 and the one in which the interposer is laminated together with the device plates manufactured from the device wafers as in the laminated chip package 100 illustrated in FIG. 5. In this embodiment, each of the device plate and the interposer is referred to as a semiconductor plate.

Method of Manufacturing Semiconductor Wafer

For manufacturing the semiconductor wafer 93, a wafer is prepared such as the silicon wafer 2 or the like which has no semiconductor devices such as the memory portions 11, 12, 13 and 14 formed thereon. For the wafer, the groove portions 20 and 21 and the insulating layers 22 and 24 are formed as in the case of the semiconductor wafer 1. Then, the wiring electrodes 15 and 16 are formed as in the case of the semiconductor wafer 1, whereby the semiconductor wafer 93 can be manufactured.

Other Embodiments

Figure 16:
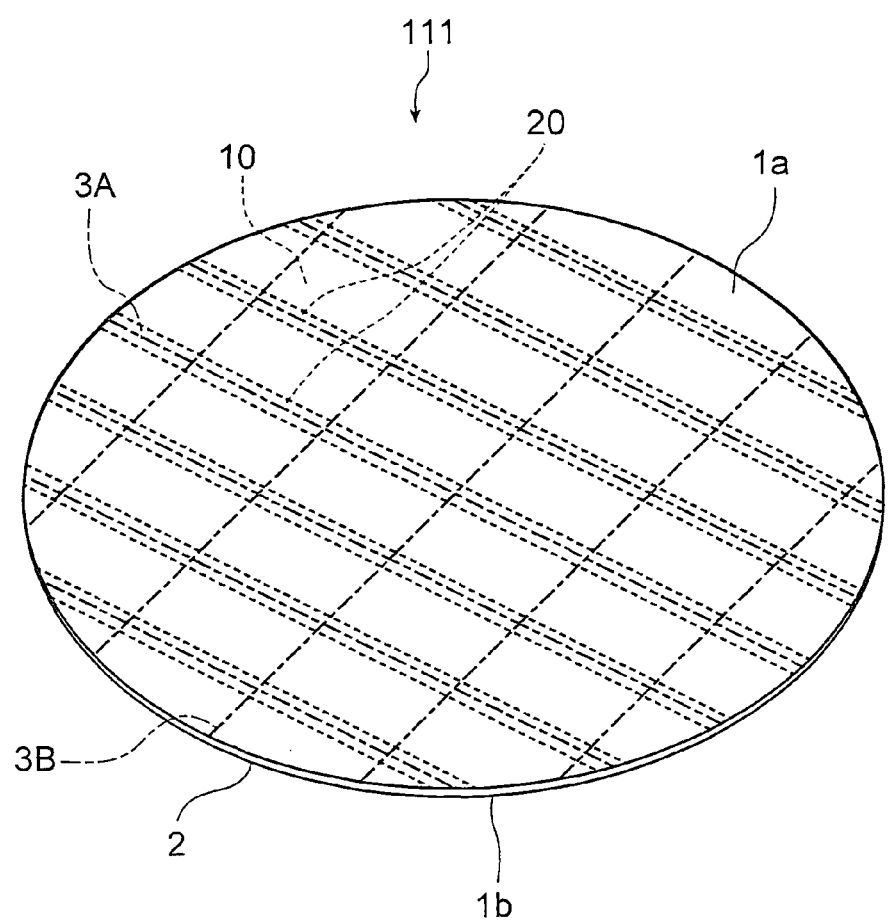
FIG. 16 is a perspective view illustrating the entire semiconductor wafer according to another embodiment of the present invention.
Figure 17:
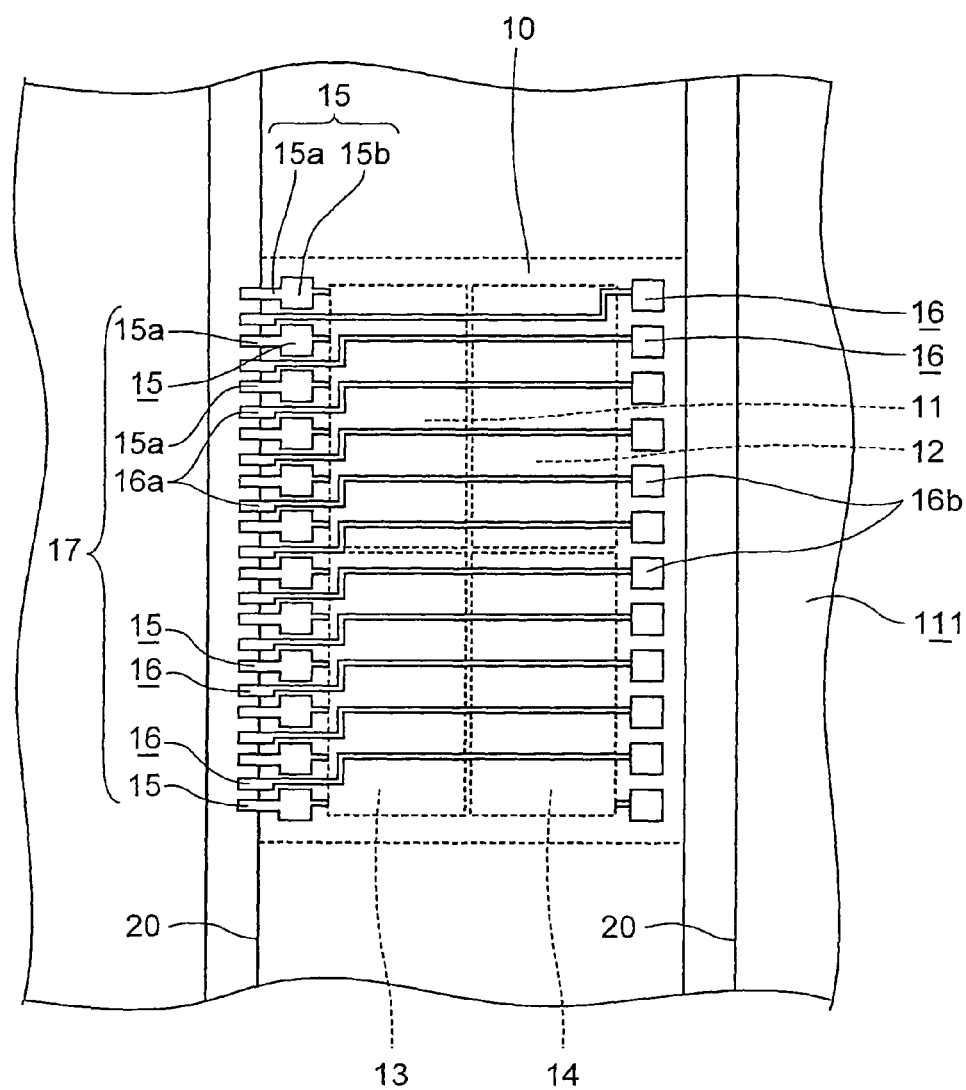
FIG. 17 is a plan view illustrating a device region and a region surrounding it formed in the semiconductor wafer in FIG. 16.

A semiconductor wafer 111 will be described with reference to FIG. 16, FIG. 17 and FIG. 18. In the semiconductor wafer 1 according to the first embodiment, the groove portions 20 and 21 are formed. The semiconductor wafer 111 is different from the semiconductor wafer 1 in that groove portions 21 are not formed but only groove portions 20 are formed. Accordingly, the semiconductor wafer 111 is formed such that a plurality of groove portions 20 are arranged at regular intervals and the groove portions are formed in the shape of stripes not intersecting with each other.

Figure 18:
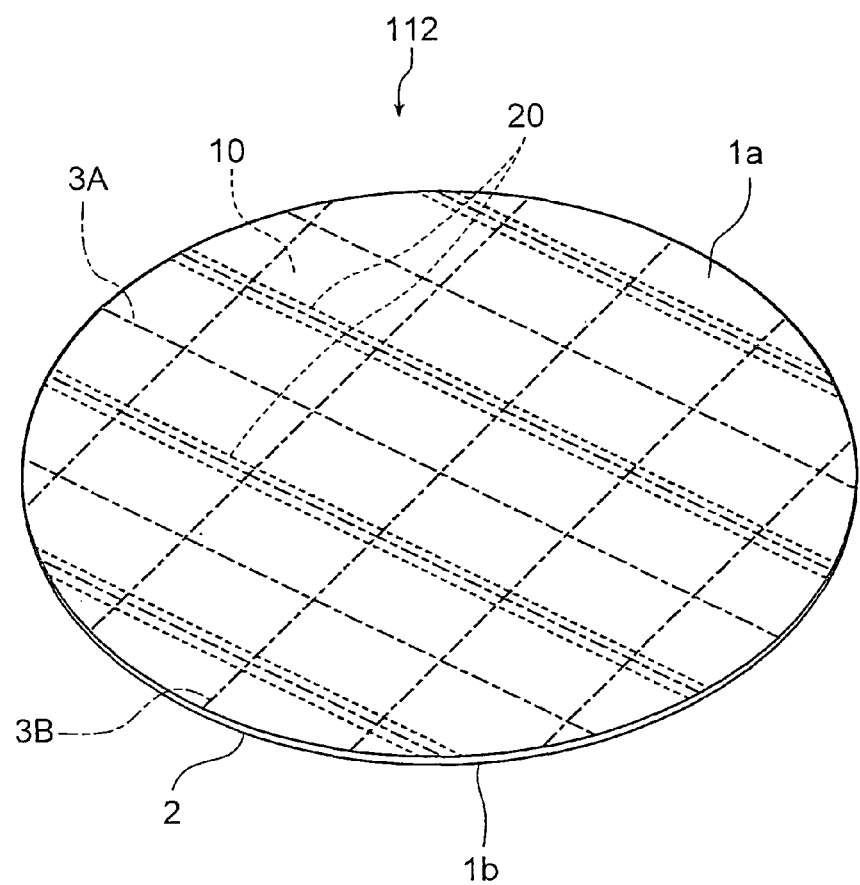
FIG. 18 is a perspective view illustrating the entire semiconductor wafer according to still another embodiment of the present invention.

A semiconductor wafer 112 illustrated in FIG. 18 is the same as the semiconductor wafer 111 in that only groove portions 20 are formed, but the groove portion 20 is formed along every other scribe line 3A.

In the semiconductor wafer 1, the device region 10 is in contact with the four groove portions 20 and 21, so that the device region 10 is in contact with the groove portions 20 and 21 in the four, that is, upper, lower, right and left directions. Accordingly, as illustrated in FIG. 6, the device plate 50 manufactured from the semiconductor wafer 1 is covered by the same insulating portion 31 in the four, upper, lower, right and left directions.

Figure 22:
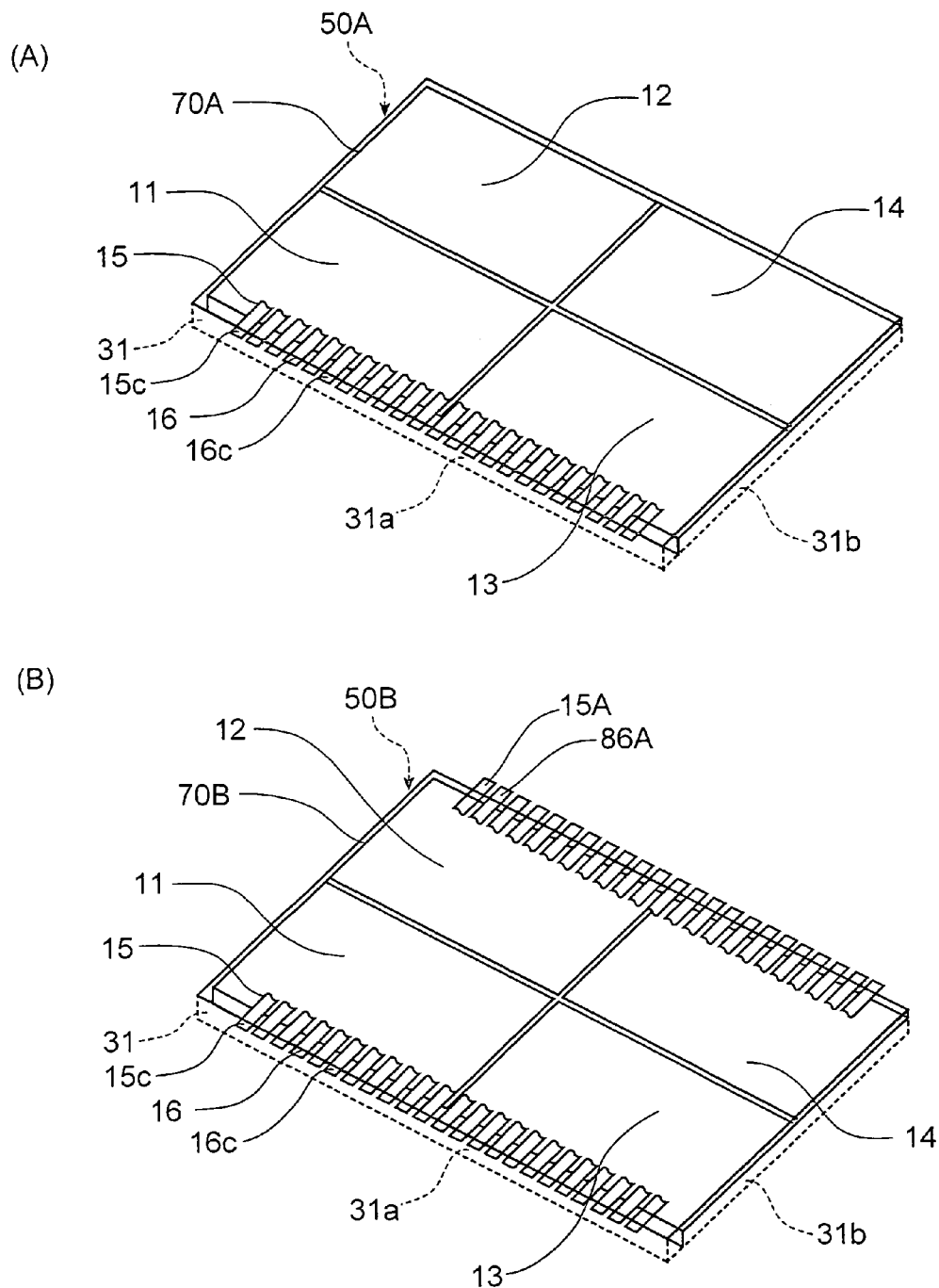
FIG. 22 are perspective views of device plates, (A) is illustrating a device plate 50A, and (B) is illustrating a device plate 50B.

In contrast, in the semiconductor wafer 111, the device region 10 is in contact with the groove portions 20 only in the two, that is, right and left directions. Accordingly, a device plate 50B using the semiconductor wafer in which the grove portions are formed in the shape of stripes as in the semiconductor wafer 111 is as illustrated in FIG. 22(B). The device plate 50B has two sets of opposite side surfaces, that is, a side surface 31a and a side opposite thereto and a side surface 31b and a side opposite thereto, which are structured such that only the side surface 31a and the side opposite thereto are covered by the insulating layers but the side surface 31b and the side opposite thereto are not covered by any insulating layer.

Further, the device plate 50B is formed such that the two opposite side surfaces 31a of a semiconductor chip 70B are covered by the insulating layers made of the same material (the insulating layers 22), and the wiring end faces 15c and 86c of wiring electrodes 15 and 86 are formed in both of the side surfaces 31a. Note that the device plate 50B has the semiconductor chip 70B that is similar to the semiconductor chip 70.

In the semiconductor wafer 112, the device region 10 is in contact with the groove portion 20 only in any one of right and left directions. Therefore, the device plate 50A using the semiconductor wafer in which the groove portions are formed along every other scribe line as in the semiconductor wafer 112 is as illustrated in FIG. 22(A). In the device plate 50A, wiring end faces 15c and 16c covered by the insulating layer (the insulating layer 22) are formed only in any one (the side surface 31a) of the four, upper, lower, right and left directions. The side surfaces other than the side surface 31a, such as the side surfaces 31b and the like are not covered by any insulating layer.

Figure 21:
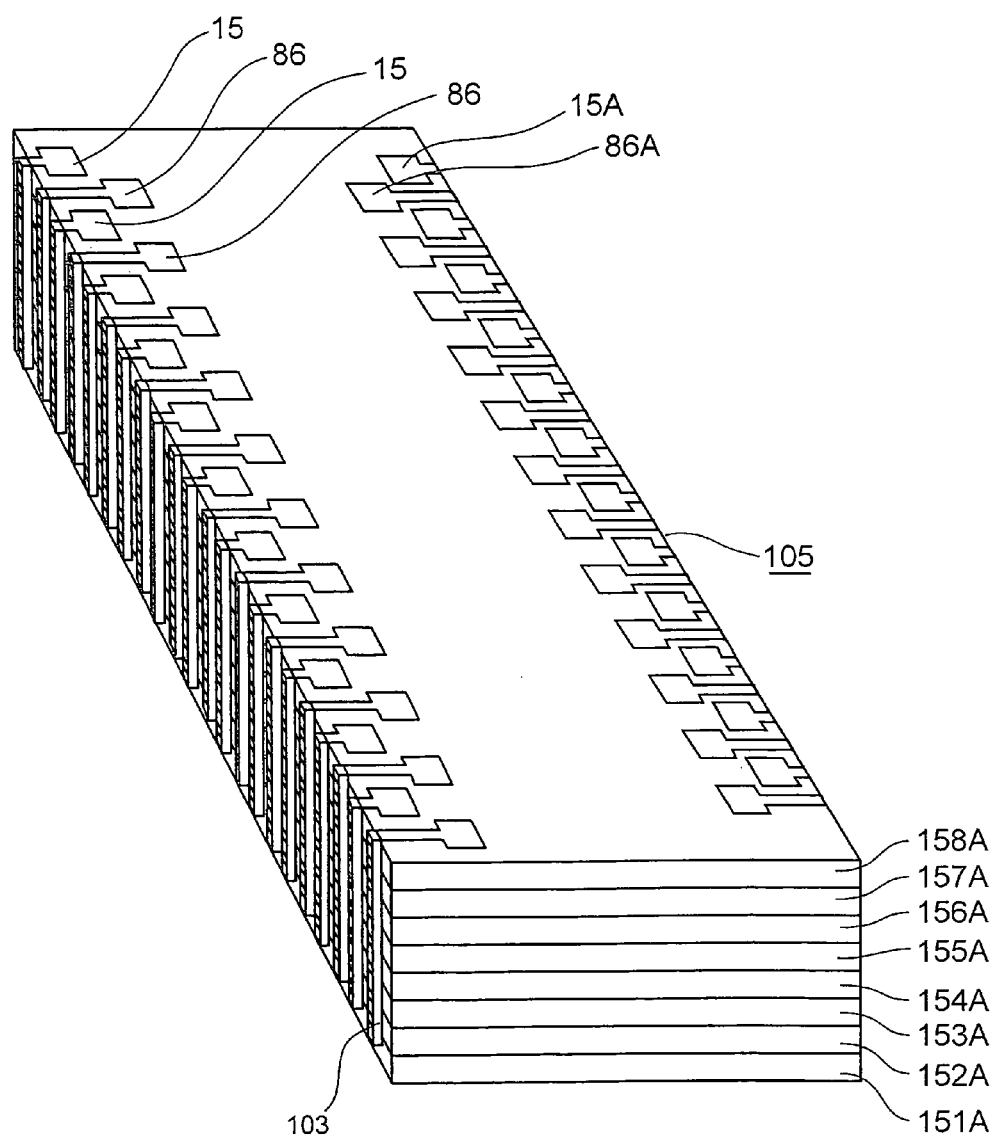
FIG. 21 is a perspective view illustrating still another laminated chip package.

FIG. 21 is a perspective view illustrating a laminated chip package 105 having a device block which is obtained by laminating eight device plates 151A to 158A each of which is the same as the device plate 50B. In the laminated chip package 105, connecting electrodes 103 are formed on two opposite side surfaces.

What is claimed is:

1. A semiconductor substrate comprising:
   a plurality of groove portions formed along scribe lines;
   insulating layers formed in the plurality of groove portions;
   a unit region surrounded by the plurality of groove portions;
   a wiring electrode including an extended terminal portion, the extended terminal portion of the wiring electrode extending from the unit region over an inside of one of the plurality of groove portions without passing across the one of the plurality of groove portions, an entirety of the extended terminal portion of the wiring electrode being flat without bending; and
   a surface insulating film which covers the insulating layers and has a connecting hole formed therein, the surface insulating film being formed without being divided into separate sections by the groove portions,
   wherein the wiring electrode is formed on the surface insulating film and is connectable via the connecting hole, the surface insulating film has an upper surface in contact with the wiring electrode and continuously extends across the plurality of groove portions, and the entire upper surface is flat.

2. The semiconductor substrate according to claim 1,
   wherein the unit region is formed as a device region having a semiconductor device,
   the surface insulating film covers the semiconductor device, and
   the wiring electrode is connected to the semiconductor device via the connecting hole.

3. The semiconductor substrate according to claim 1, wherein the extended terminal portion is formed to overlap one of the insulating layers, the one of the insulating layers being formed in the one of the plurality of groove portions.

4. The semiconductor substrate according to claim 1, wherein the wiring electrode has an electrode pad connected to the extended terminal portion, the electrode pad being a part of the wiring electrode and being wider than the extended terminal portion.

5. The semiconductor substrate according to claim 2, wherein the plurality of groove portions are formed in a shape of stripes without intersecting with each other.

6. The semiconductor substrate according to claim 5, wherein the plurality of groove portions are formed along every other scribe line, such that the groove portions and scribe lines are positioned alternately in the semiconductor substrate.

7. The semiconductor substrate according to claim 1, wherein a plurality of the wiring electrodes are arranged along at least one of the plurality of groove portions in contact with the unit region and form a wiring electrode group having an unevenly distributed structure in which the respective extended terminal portions thereof are unevenly extended at a part of the at least one of the plurality of groove portions.

8. The semiconductor substrate according to claim 2, wherein a plurality of the wiring electrodes are arranged along at least one of the plurality of groove portions in contact with the unit region and form a wiring electrode group having an unevenly distributed structure in which the respective extended terminal portion thereof are unevenly extended at a part of the at least one of the plurality of groove portions, and further have electrode pads connected to the extended terminal portions and form a gathered pad group in which all of the electrode pads are gathered between the extended terminal portions and the semiconductor device.

9. The semiconductor substrate according to claim 4, wherein the extended terminal portion has a narrow-width structure narrower in width than the electrode pad.

10. The semiconductor substrate according to claim 1, each of the insulating layers being formed by embedding an insulating material in a corresponding one of the plurality of groove portions, each insulating layer completely filling in the corresponding groove portion without leaving a gap in the groove portion.

11. The semiconductor substrate according to claim 4, the electrode pad being arranged in the unit region.

12. The semiconductor substrate according to claim 1, the wiring electrode being formed only on the unit region without crossing the groove portions to reach neighboring unit regions.

13. The semiconductor substrate according to claim 1, each insulating layer completely filling in the corresponding groove portion without leaving a gap in the groove portion.

14. The semiconductor substrate according to claim 1, wherein the wiring electrode is formed on the surface insulating film and is directly connected to the semiconductor device via the connecting hole.

15. The semiconductor substrate according to claim 1, wherein a length of the extended terminal portion of the wiring electrode is shorter than a width of the plurality of groove portions.

16. The semiconductor substrate according to claim 1, wherein a surface of the insulating layer is covered by the surface insulating film such that a joint exists between the insulating layer and the surface insulating film.

17. The semiconductor substrate according to claim 1, wherein the wiring electrode also includes an electrode pad connected to the extended terminal portion, the electrode pad having a width larger than that of the extended terminal portion.

\* \* \* \* \*